(12) United States Patent
Jambunathan et al.

(10) Patent No.: US 11,056,592 B2
(45) Date of Patent: Jul. 6, 2021

(54) SILICON SUBSTRATE MODIFICATION TO ENABLE FORMATION OF THIN, RELAXED, GERMANIUM-BASED LAYER

(71) Applicant: INTEL CORPORATION, Santa Clara, CA (US)

(72) Inventors: Karthik Jambunathan, Hillsboro, OR (US); Cory C. Bomberger, Portland, OR (US); Glenn A. Glass, Portland, OR (US); Anand S. Murthy, Portland, OR (US); Ju H. Nam, Hillsboro, OR (US); Tahir Ghani, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/611,920

(22) PCT Filed: Jun. 30, 2017

(86) PCT No.: PCT/US2017/040320
§ 371 (c)(1),
(2) Date: Nov. 8, 2019

(87) PCT Pub. No.: WO2019/005112
PCT Pub. Date: Jan. 3, 2019

(65) Prior Publication Data
US 2021/0083116 A1    Mar. 18, 2021

(51) Int. Cl.
*H01L 29/78* (2006.01)
*H01L 27/092* (2006.01)

(52) U.S. Cl.
CPC ...... *H01L 29/7849* (2013.01); *H01L 27/0924* (2013.01)

(58) Field of Classification Search
CPC ............ H01L 29/7849; H01L 27/0924; H01L 29/7842; H01L 29/785; H01L 21/02381
See application file for complete search history.

(56) References Cited

U.S. PATENT DOCUMENTS 9,502,420 B1    11/2016  Bedell et al.
9,524,969 B1 *  12/2016  Balakrishnan ............................ H01L 21/823821

(Continued)

FOREIGN PATENT DOCUMENTS

WO    2019005112 A1    1/2019

OTHER PUBLICATIONS

International Search Report and Written Opinion received for PCT Application No. PCT/US2017/040320. dated Feb. 23, 2018. 15 pages.

(Continued)

*Primary Examiner* — Douglas W Owens
(74) *Attorney, Agent, or Firm* — Schwabe, Williamson & Wyatt, P.C.

(57) ABSTRACT

An integrated circuit (IC) includes a substrate that includes silicon. A first layer is on the substrate and includes a first monocrystalline semiconductor material, the first layer having a plurality of defects. A second layer is on the first layer and includes a second monocrystalline semiconductor material that includes germanium. A strained channel structure is above the first layer. A gate structure is at least above the channel structure. A source region is adjacent the channel structure. A drain region is adjacent the channel structure, such that the channel structure is laterally between the source region and the drain region.

20 Claims, 10 Drawing Sheets

(56) References Cited

U.S. PATENT DOCUMENTS

| | | | |
|---|---|---|---|
| 9,570,298 B1* | 2/2017 | Basker | H01L 21/02381 |
| 2006/0019466 A1 | 1/2006 | Nayfeh et al. | |
| 2013/0334606 A1 | 12/2013 | Shen et al. | |
| 2014/0027816 A1 | 1/2014 | Cea et al. | |
| 2016/0104799 A1 | 4/2016 | Qi et al. | |
| 2016/0293601 A1 | 10/2016 | Majhi et al. | |
| 2018/0047832 A1 | 2/2018 | Tapily et al. | |
| 2018/0151452 A1 | 5/2018 | Doornbos et al. | |
| 2020/0127101 A1* | 4/2020 | Narita | H01L 29/402 |

OTHER PUBLICATIONS

Lin, Hai, "Growth and Characterization of GeSn and SiGeSn Alloys for Optical Interconnects," Submitted to the Department of Materials Science and Engineering and the Committee on Graduate Studies of Stanford University, May 2012. 139 pages.

"Realization of Silicon-Germanium-Tin (SiGeSn) Source/Drain Stressors by Sn implant and Solid Phase Epitaxy for strain engineering in SiGe channel P-MOSFET," IEEE Xplore: May 23, 2008. 2 pages.

Fan, et al., "SiGeC/Si superlattice microcoolers," Applied Physics Letters, vol. 78, issue 11. Published Online: Mar. 8, 2001. 8 pages.

Yamanaka, et al., "Strain Relaxation and Induced Defects in SiGe Thin Films Grown on Ion-Implaneted Si Substrates," Materials Transactions, vol. 45., No. 8. 2004, The Japan Institute of Metals. pp. 2644-2646.

International Preliminary Report on Patentability received for PCT Application No. PCT/US2017/040320. dated Jan. 9, 2020. 12 pages.

Exended European Search Report received for EP Application No. 19183091.8, dated Dec. 16, 2019. 9 pages.

* cited by examiner

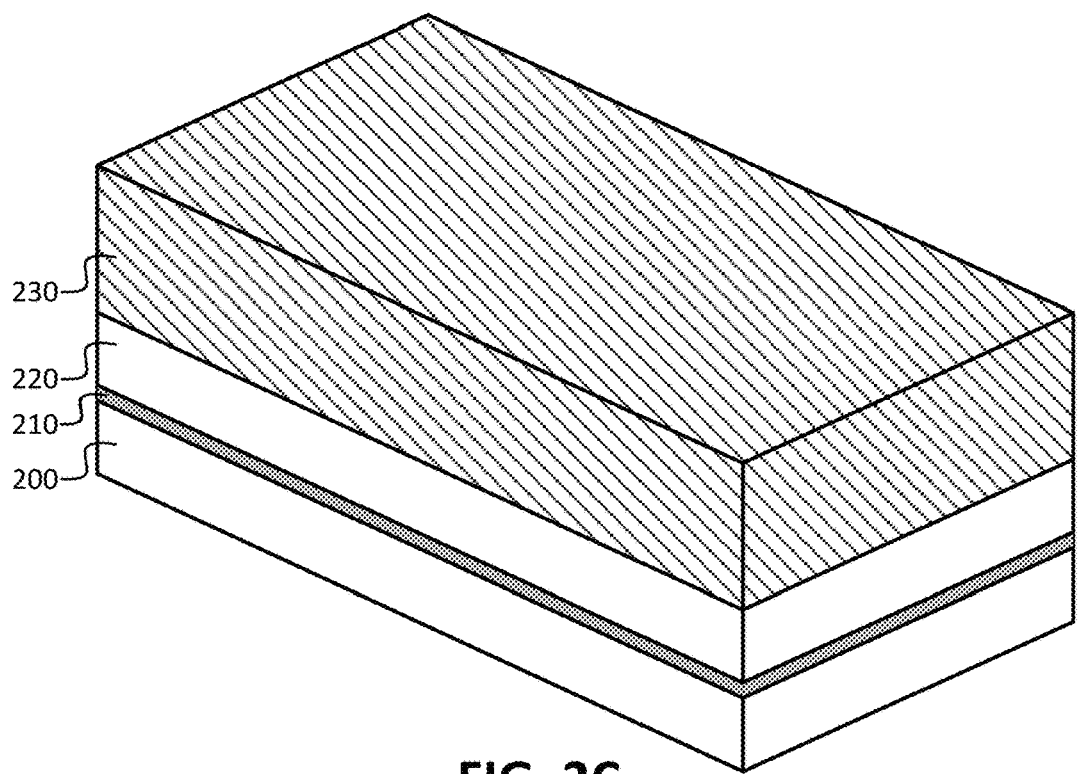
FIG. 2C
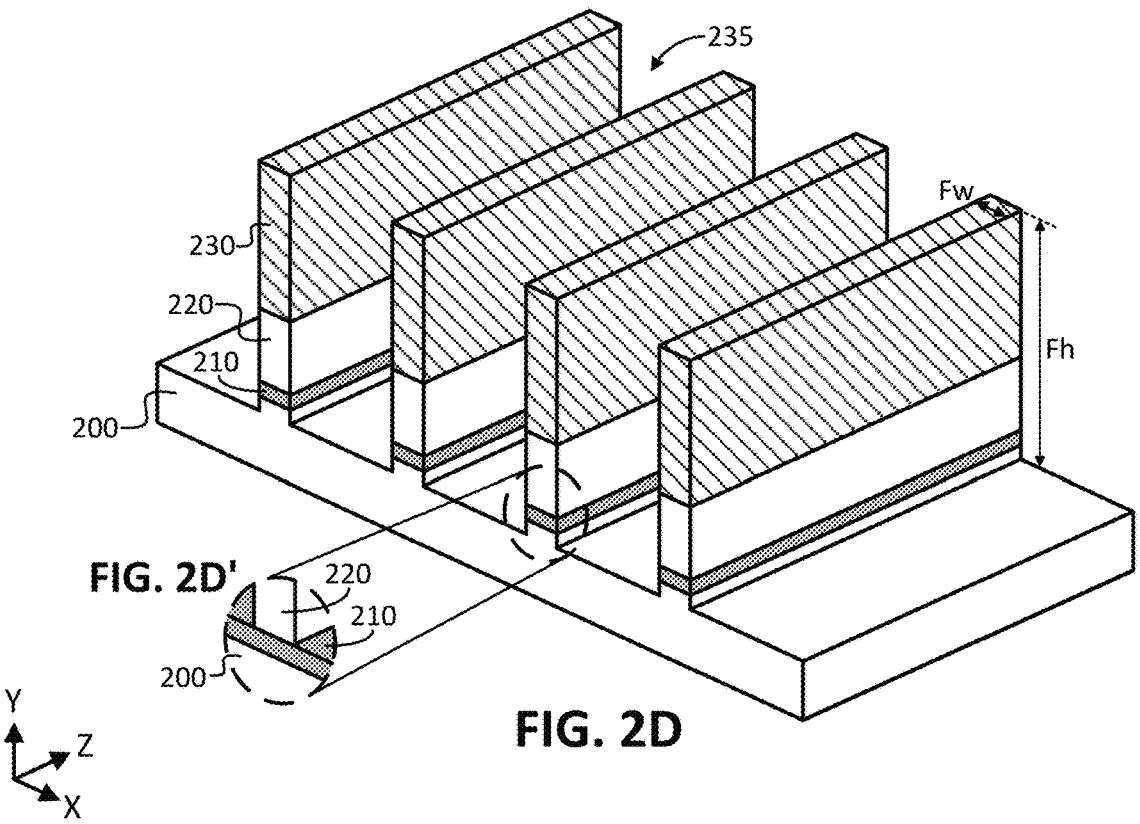
FIG. 2D'
FIG. 2D

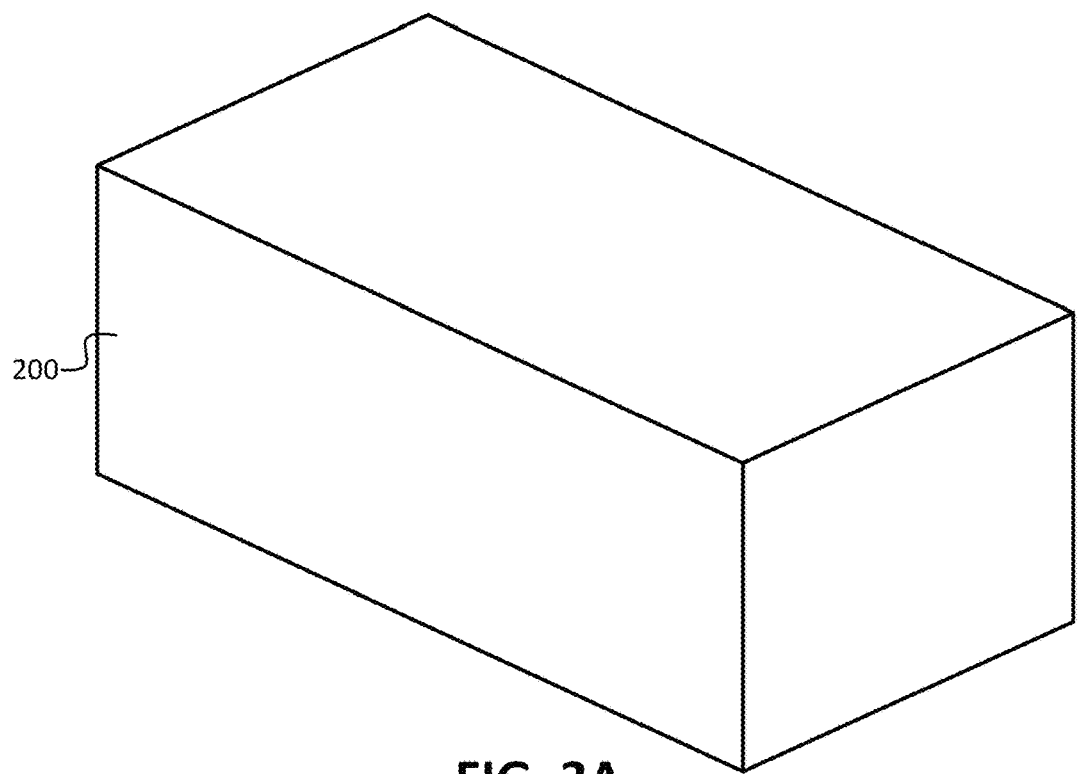
FIG. 3A
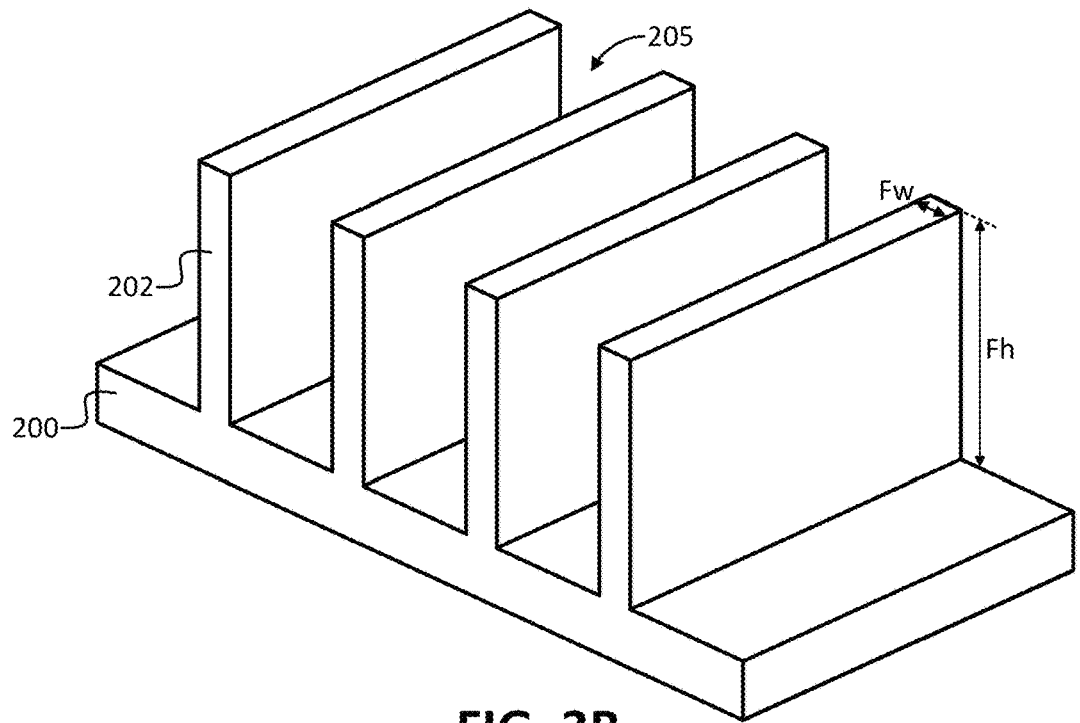
FIG. 3B
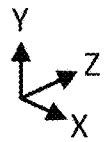

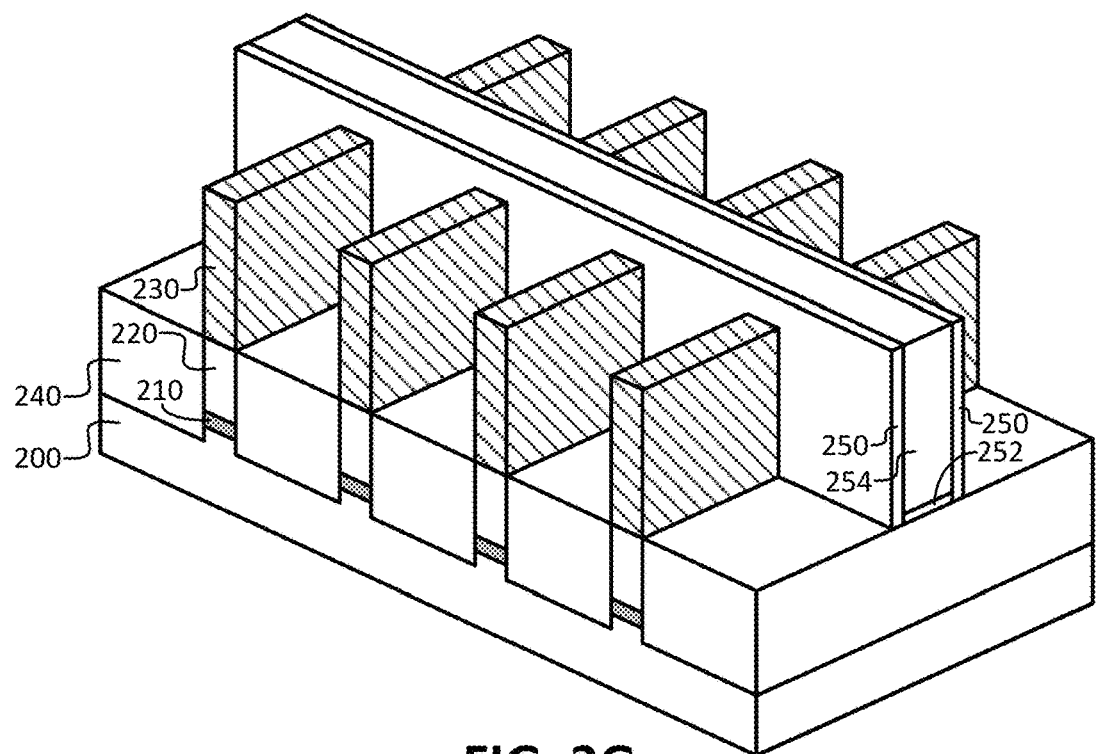
FIG. 3G
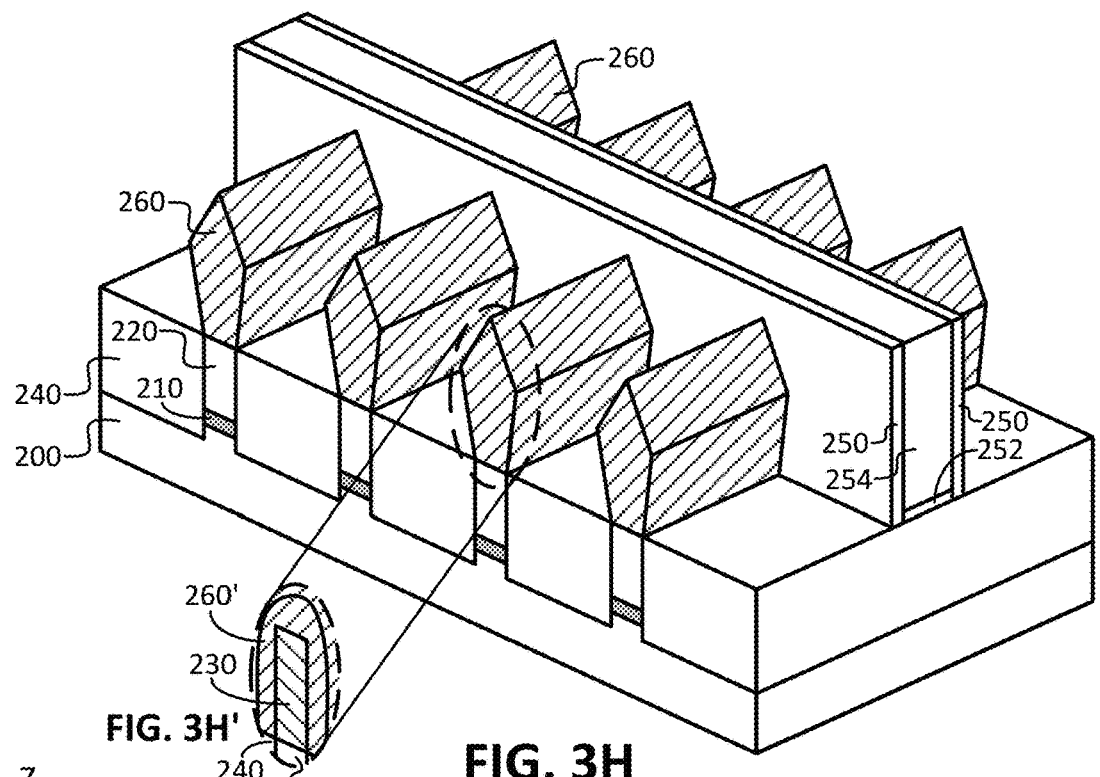
FIG. 3H
FIG. 3H'
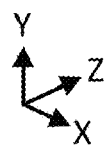

Defects (211) Nucleating in Modification Layer
(210) and Propagating Towards Si Substrate (200)

SILICON SUBSTRATE MODIFICATION TO ENABLE FORMATION OF THIN, RELAXED, GERMANIUM-BASED LAYER

CROSS-REFERENCE TO RELATED APPLICATIONS

This patent application is a U.S. National Phase Application under 35 U.S.C. § 371 of International Application No. PCT/US2017/040320, filed on Jun. 30, 2017, the entire contents of which is hereby incorporated by reference herein.

BACKGROUND

Semiconductor devices are electronic components that exploit the electronic properties of semiconductor materials, such as silicon (Si), germanium (Ge), and gallium arsenide (GaAs). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer regions of the fin (e.g., top and two sides), such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). Generally, such multiple-gate FETs may be referred to as MuGFETs. A nanowire transistor (sometimes referred to as a gate-all-around (GAA) or nanoribbon transistor) is configured similarly to a fin-based transistor, but instead of a finned channel region where the gate is on three portions (and thus, there are three effective gates), one or more nanowires are used for the channel region and the gate material generally surrounds each nanowire.

BRIEF DESCRIPTION OF THE DRAWINGS

FIGS. 2A-D illustrate example IC structures formed when carrying out some of the method of FIG. 1 using a blanket deposition approach, in accordance with some embodiments of the present disclosure. Note that the example structures of FIGS. 2A-D continue on to the example structures of FIGS. 3E-J.

FIG. 2D' illustrates a blown-out portion of FIG. 2D showing an alternative patterning process where the etch processing stops at the modification layer, in accordance with some embodiments.

FIGS. 3A-J illustrate example IC structures formed when carrying out the method of FIG. 1 using a replacement fin-based approach, in accordance with some embodiments of the present disclosure.

FIG. 3F' illustrates a blown-out portion of FIG. 3F showing an alternative shallow trench isolation (STI) material recess location, in accordance with some embodiments.

FIG. 3F" illustrates the blown-out portion of FIG. 3F', where the channel material layer is not present such that only the Ge-based layer is included in the active fin height, in accordance with some embodiments.

FIG. 3H' illustrates a blown-out portion of FIG. 3H showing a source/drain region formed using a cladding scheme, in accordance with some embodiments.

Figure 1:
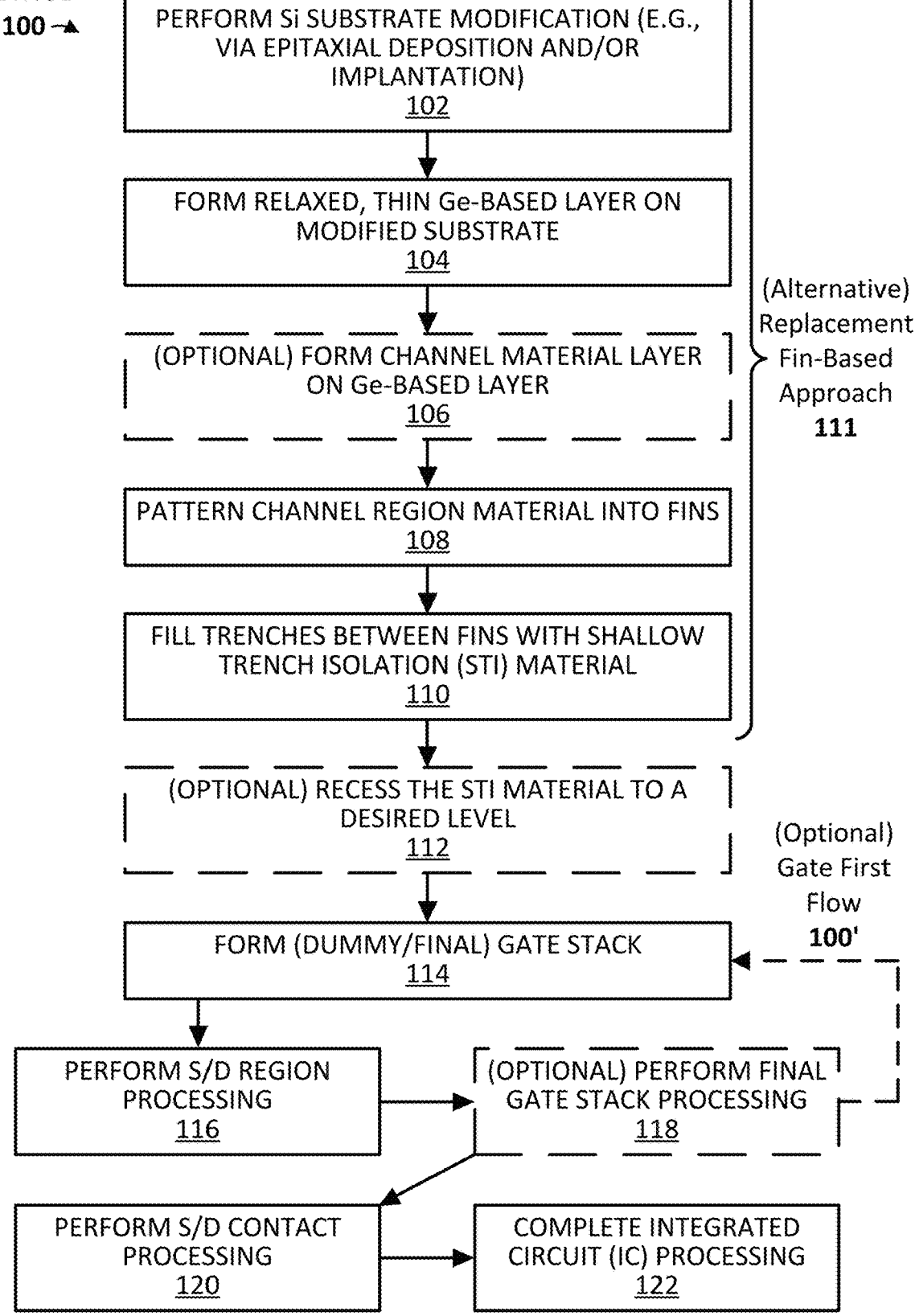
FIG. 1 illustrates a method of forming an integrated circuit (IC) including a modified silicon substrate that enables formation of a thin, relaxed, Ge-based layer, in accordance with some embodiments of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

In the context of transistors, for many integrated circuit (IC) applications, it is desired to increase the mobility of the charge carriers in the channel. For instance, for PMOS devices in such applications, it is desired to increase the mobility of holes in the channel, and for NMOS devices in such applications, it is desired to increase the mobility of electrons in the channel. A technique for increasing charge carrier (e.g., hole or electron) mobility is to impart strain on the channel region of the transistor via the source/drain (S/D) regions. However, as transistors shift to non-planar configurations and scale down to have smaller critical dimensions, such as smaller gate lengths (e.g., sub-100 nanometer (nm) or sub-50 nm gate lengths), the aforementioned strain technique is not effective due to poor mechanical coupling between the channel and the S/D regions. This limits the channel mobilities capable of being achieved to a relatively lower value. In addition, the use of a Si substrate, which is standard for many IC applications, further limits the ability to impart strain on transistor channel regions, as Si provides a single lattice constant value from which to form subsequent semiconductor material. Accordingly, it can be difficult to form different channel region materials with different strain values, particularly for CMOS applications that utilize both NMOS and PMOS devices.

For instance, NMOS and PMOS devices generally perform better using different materials for the different devices, as different materials can achieve different carrier mobilities depending on whether the carriers are electrons (in the case of NMOS) or holes (In the case of PMOS). For example, in the context of using group IV semiconductor material for transistor channel regions, Si or low-Ge content SiGe is generally preferred for NMOS devices and high-Ge content SiGe or Ge is preferred for PMOS devices. Further, NMOS devices generally perform better with increased tensile strain in the channel region and PMOS devices generally perform better with increased compressive strain in the channel region. Current techniques attempt to achieve the combination of the different strained materials by growing a very thick buffer layer (e.g., 0.5-1 microns, or even thicker) of relaxed SiGe on Si in an attempt to provide the required seeding layer from which to grow the different transistor channel materials while maintaining the preferred strain. Such a thick buffer layer is employed to attain the high relaxation percentage and low surface dislocation density required to provide a suitable seeding layer surface from which to grow the different strained channel region materials. However, employing such a thick buffer layer causes wafer bowing downstream in the IC fabrication process, which is highly undesirable as it can create and/or exacerbate defects and dislocations within the IC devices. Alternatively, employing a relatively thinner buffer layer (e.g., having a thickness of at most 0.5 micron or 500 nm) would cause defects within the thinner buffer layer to propagate to its top surface, thereby affecting the quality of the top surface of the thinner buffer layer. Further, if transistor channel material is grown from that top surface of the thinner buffer layer in an effort to impart strain on the channel material, then the defects would propagate from the top surface of the thinner buffer layer into the channel material, resulting in the loss of strain and thereby degrading charge carrier mobility.

Thus, and in accordance with various embodiments of the present disclosure, techniques are provided for performing Si substrate modification to enable formation of a thin, relaxed, Ge-based layer on the modified Si substrate. In some embodiments, the thin, relaxed, Ge-based layer, may serve as a template for the growth of compressively strained PMOS channel material and tensile strained NMOS channel material to achieve gains in hole and electron mobility, respectively, in the channel regions of the devices. Note that the thin, relaxed, Ge-based layer as described herein may be referred to herein as simply a thin Ge-based layer or a Ge-based layer. In some embodiments, the Ge-based layer described herein may include a thickness of at most 500 nm to help with wafer bowing issues that arise from use of buffer layers that are greater than 500 nm, for example. In some such embodiments, such a relatively thin Ge-based layer can be formed with suitable surface quality/relaxation levels due to the modification of the Si substrate prior to forming the relative thin Ge-based layer. For instance, in some embodiments, the Si substrate is modified at the interface of the Si substrate and the Ge-based layer (prior to forming the Ge-based layer) by depositing an interfacial layer at that interface and/or by implanting a layer of one or more species into the top surface of the substrate. In general, the result of any such Si substrate modifications is a modification layer (whether epitaxial grown and/or ion implanted) at the interface between the Si substrate and the Ge-based layer.

Therefore, in some embodiments, the modification layer allows for efficient defect generation to relax the subsequently formed thin Ge-based layer toward its bulk/unstrained lattice constant value. Further, in some embodiments, the modification layer provides effective defect capture or trapping near the interface of the Si substrate and the modification layer, to help prevent the defects from reaching the top surface of the thin Ge-based layer and, where employed, from reaching any transistor channel material formed on the thin Ge-based layer. Therefore, the modification layer as described herein enables the formation of a thin Ge-based layer (e.g., having a thickness of at most 500 nm) for a multitude of transistor-based applications, as will be apparent in light of this disclosure. For instance, in an example embodiment, the techniques described herein allow for the growth of a thin (e.g., less than 250 nm thick), relaxed (e.g., with greater than 80% relaxation) SiGe layer (e.g., with a Ge content of less than 35% by atomic percentage) with a low top surface dislocation density (e.g., less than 1E7 atoms per square centimeter) on a Si substrate by employing a modification layer. In such an example embodiment, the thin, relaxed SiGe layer (e.g., with 30% Ge content by atomic percentage or $Si_{0.7}Ge_{0.3}$) can serve as the template for the growth of compressively strained SiGe channel PMOS devices (e.g., with 50% Ge content by atomic percentage or $Si_{0.5}Ge_{0.5}$) and tensile strained Si channel NMOS devices, thereby simultaneously achieving large gains in hole mobility for the PMOS devices and electron mobility for the NMOS devices, which improves the performance of the devices. Further, in such an example embodiment, the PMOS and NMOS devices may be included in a CMOS circuit, where the techniques described herein help facilitate the co-integration (particularly in close proximity) of high-performance PMOS and NMOS devices.

The modification layer, in some embodiments, is deposited on the substrate as a distinct layer that is not native to the Si substrate. In other words, in some such embodiments, the modification layer is grown as a new and separate material layer from the top surface of the Si substrate as opposed to modifying the original material on the top of the substrate. In such embodiments where the modification layer is grown as a separate layer, it may include any suitable semiconductor material and be formed with a monocrystalline or single-crystal structure. Further, in such embodiments, the deposited modification layer (e.g., grown via epitaxial processing) may include compositionally different semiconductor material than Si (which is the semiconductor of the substrate on which it is deposited). For instance, in some such embodiments, a deposited modification layer may include a compositionally different group IV semiconductor material, such as SiGe or Ge, which may or may not include alloying with tin (Sn) and/or carbon (C). Note that although the substrate is referred to herein as a Si substrate, it may include doping in at least a portion of the substrate, in some embodiments. For instance, in some such embodiments, a top portion of the substrate may include p-type dopant (e.g., boron) and/or n-type dopant (e.g., phosphorous, arsenic). However, in other embodiments, the Si substrate may be intrinsic or undoped. Regardless, in some embodiments, the semiconductor material of the Si substrate may essentially consist of Si semiconductor material (with or without included dopant).

The modification layer, in some embodiments, is an implanted layer formed in a portion of the top of the Si substrate. Thus, in some such embodiments, the modification layer may be native to the Si substrate. The implantation processing, in some such embodiments, may include ion implantation (or other suitable techniques) that drive one or more chemical species into the top surface of the substrate. For instance, the chemical species that are implanted may include Si, Ge, C, Sn, hydrogen (H), helium (He), phosphorous (P), boron (B), arsenic (As), antimony (Sb), indium (In), gallium (Ga), argon (Ar), and/or nitrogen (N). Such chemical species can be implanted while maintaining a monocrystalline or single-crystal structure for the semiconductor modification layer. In some embodiments, a combination of implantation and growth of the modification layer may be performed. For instance, in some such embodiments, ion implantation may be performed on the top surface of a Si substrate followed by the deposition of a distinct modification layer. In other embodiments, a distinct modification layer may be deposited on the top surface of a Si substrate followed by annealing to drive chemicals from the modification layer into the top surface of the Si substrate. In some such embodiments, the interface between the modification layer and the top surface of the Si substrate may become less distinct or essentially merge together. Accordingly, the modification layer may or may not have a multilayer structure.

Regardless of how the modification layer is formed, it can be characterized by the nucleation of defects (e.g., dislocations and/or stacking faults) which predominantly terminate within the substrate or in the bottom portion of the thin, relaxed, Ge-based layer, rather than running through to the top portion of the Ge-based layer. Therefore, the modification layer releases the energy required to form such defects in the first instance, and thus, the modification layer may be considered a high entropy layer. Without the presence of the modification layer, forming a thin Ge-based layer (e.g., with a thickness of less than 500 nm) on a Si substrate would result in relatively more defects propagating to the top surface of the thin Ge-based layer, which is undesirable as previously described. In some embodiments, the modification layer (whether deposited and/or implanted) may have a vertical thickness in the range of 2-100 nm (or in a subrange of 2-25, 2-50, 2-75, 3-25, 3-50, 3-100, 5-25, 5-50, 5-100, 10-25, 10-50, 10-100, 25-50, or 25-100 nm) and/or it may have a maximum vertical thickness of at most 100, 75, 50, 40, 30, 25, 20, 15, 10, or 5 nm, for example. Other suitable thickness values, ranges, and thresholds will be apparent in light of this disclosure. Numerous variations and configurations for the modification layer will be apparent in light of this disclosure.

The Ge-based layer, in some embodiments, may include SiGe or Ge that may or may not be alloyed with tin and/or carbon. In some embodiments, the Ge-based layer may or may not be doped with any suitable dopant (e.g., boron, phosphorous, and/or arsenic). As previously stated, by forming the Ge-based layer on the modification layer, the Ge-based layer can relax, at least in part, depending on the particular configuration. For instance, in some embodiments, the Ge-based layer may relax to within 50, 45, 40, 35, 30, 25, 20, 15, 10, or 5% of its bulk lattice parameters, for example. By way of example, if the Ge-based layer is a Ge layer, which has a lattice constant of 5.658 angstroms (Å) at 300 Kelvin (K), and it is formed on a Si substrate, which has a lattice constant of 5.431 Å at 300 K, and that Ge layer were relaxed to within 50% of its bulk lattice constant, then it would have a lattice constant in the range of approximately 5.545-5.659 Å at 300 K (which can be measured using TEM). By way of another example, if the Ge-based layer is a SiGe layer having a concentration of 30% Ge, which has a lattice constant of approximately 5.499 Å at 300 K, and it is formed on a Si substrate with a relaxation value to within 20% of its bulk lattice parameters, then that $Si_{0.7}Ge_{0.3}$ Ge-based layer would have a lattice constant of approximately 5.485-5.499 Å at 300 K. Note that in some embodiments, the relaxation of the Ge-based layer may be measured in a top portion near the top surface, which may be the relevant portion as it may be used as the template/seeding surface from which subsequently strained transistor channel material is formed.

As was also previously stated, in the IC stack of layers, the modification layer causes the formation of defects (e.g., dislocations and/or stacking faults) that mostly terminate within the Si substrate or a lower portion of the Ge-based layer, rather than running through to the top portion/surface of the Ge-based layer. Therefore, the modification layer allows the thin Ge-based layer to relax, at least in part. In some embodiments, the top portion/surface of the Ge-based layer may have a relatively low defect or dislocation density, such as less than 1E9 per square cm, which is the typical minimum threshold defect/dislocation density that would form at the top portion/surface of the Ge-based layer if the modification layer were not employed. In some such embodiments, the top portion/surface of the Ge-based layer may have a defect/dislocation density of at most 1E9, 5E8, 1E8, 5E7, 1E7, 5E6, 1E6, 5E5, 1E5, 5E4, or 1E4 per square cm, for example. In some embodiments, the top portion/surface of the Ge-based layer may include essentially no defects or dislocations, as they may terminate prior to reaching that top portion/surface. Note that "aEb" as used herein equates to "a times 10 raised to the power of b", where 'a' and 'b' are real numbers. For example, 1E9 can also be expressed as 1 times 10 raised to the power of 9, or simply, 10 to the power of 9 ($10^{[<]BEGINITALm}9$). Also note that when the top portion/surface or surface/portion of the Ge-based layer is referred to herein, such description may pertain to the top-most surface of the Ge-based layer (e.g., the surface farthest from the Si substrate and the modification layer) and/or the top portion of the Ge-based layer (e.g., the top 1, 2, 3, 4, 5, 10, 15, or 20% of the Ge-based layer). Thus, reference to the top portion/surface or top surface/portion of the Ge-based layer may mean only the top surface of the Ge-based layer, only the top portion of the Ge-based layer, or both the top surface and the top portion of the Ge-based layer. Also note that in some cases, the defect/dislocation density may include the threading dislocation density.

In some embodiments, the Ge-based layer may be included, at least in part, in the channel region of one or more transistor devices. In some such embodiments, at least a portion of the Ge-based layer may make up the entirety of a given transistor's channel region, while in other embodiments, the Ge-based layer may make up only a portion of a given transistor's channel region, where subsequently formed channel material makes up the rest of the channel region, for example. In still other embodiments, the Ge-based layer may be completely below the channel region of a given transistor, where it is completely contained in a sub-channel or sub-fin region, for example. In some such embodiments, the Ge-based layer can be used as a template or a seeding layer from which to form various different channel region material, as will be described in more detail below. Further, in some such embodiments, the Ge-based layer may be oppositely type doped relative to the overlying channel region material to provide a tunnel diode to help reduce or eliminate parasitic leakage (e.g., subthreshold leakage). For instance, in some embodiments, the Ge-based layer may be intentionally p-type doped (e.g., with a doping concentration of at least 1E16, 5E16, 1E17, 5E17, 1E18, 5E18, or 1E19 atoms per cubic cm) if the overlying channel region is to be n-type doped, or vice versa, where the Ge-based layer may be intentionally n-type doped (e.g., with a doping concentration of at least 1E16, 5E16, 1E17, 5E17, 1E18, 5E18, or 1E19 atoms per cubic cm) if the overlying channel region is to be p-type doped. In some embodiments, the Ge-based layer may include a vertical thickness in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. As can be understood based on this disclosure, employing a sub-500 nm Ge-based layer can help reduce or prevent undesired wafer bowing. Other suitable thickness values, ranges, and thresholds will be apparent in light of this disclosure.

A channel material layer, in some embodiments, may be formed on the Ge-based layer to be used in the channel region of one or more transistors. As previously described, in some embodiments, a given transistor channel region may only include the Ge-based layer. However, in other embodiments, a channel material layer can be formed on the Ge-based layer, where the channel layer may include any suitable semiconductor material, such as monocrystalline group IV and/or group III-V semiconductor material. The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example. Also note that compositionally different as used herein with respect to semiconductor materials or features/layers/structures including semiconductor material means (at least) including different semiconductor materials or including the same semiconductor material but with a different compositional ratio (e.g., where the concentration of at least one component of the material is different). For instance, Ge is compositionally different than InGaAs (as they are different semiconductor materials), but $Si_{0.7}Ge_{0.3}$ is also compositionally different than $Si_{0.4}Ge_{0.6}$ (as they include different compositional ratios). Moreover, SiGe with a Ge concentration in the range of 0 to 30 atomic percentage is compositionally different than SiGe with a Ge concentration in the range of 31 to 100 atomic percentage.

In some embodiments, the channel material layer may be formed such that it is strained to the underlying Ge-based layer. Accordingly, as can be understood based on this disclosure, use of the Ge-based layer can enable different semiconductor channel material to be formed thereon in a strained manner as compared to only using the Si substrate as the template from which the semiconductor channel material is formed. This is because the Ge-based layer has sufficiently high/device quality monocrystalline semiconductor material at and near its top surface due to the reduced defect/dislocation density at that location (as a result of employing the modification layer as described herein). Further, the Ge-based layer is at least partially relaxed, thereby providing a template or seeding layer surface with a different lattice constant than that of Si (which is 5.431 Å at 300 K). This is significant, because the channel material layer would relax if there is a big enough lattice delta between its material and the material on which it is grown (e.g., if the lattice delta reaches the point of being a lattice mismatch, which typically occurs around a lattice delta of 2-3%). Thus, by allowing the lattice constant of the template/seeding surface for that channel material layer to be adjusted, through use of the Ge-based layer as described herein, the techniques described herein enable the formation of a wider range of possible fully strained channel region materials for transistor devices, such as SiGe with relatively higher Ge concentrations (e.g., greater than 30, 35, and 40% Ge by atomic percentage), Si, and various group III-V materials. In some embodiments, a given channel material layer may be strained to the underlying Ge-based layer such that the in-plane lattice parameters of the channel material layer are within 50, 45, 40, 35, 30, 25, 20, 15, 10, or 5%, or essentially the same as, the in-plane lattice parameter at/near the top surface of the Ge-based layer. Further, where a channel material layer is strained (to the underlying Ge-based layer), that strain may extend to essentially the top surface of the channel material layer, such that the channel material layer is strained throughout the layer and maintains the strain through subsequent IC processing to the end structure, in accordance with some embodiments.

In some embodiments, multiple different channel material layers may be formed on different areas of the Ge-based layer, such as for CMOS applications, for example. For instance, a first channel material layer may be formed on a first area of the Ge-based layer to be used for one or more p-channel transistor devices (e.g., one or more PMOS devices) and a second channel material may be formed on a second area of the Ge-based layer to be used for one or more n-channel transistor devices (e.g., one or more NMOS devices). As previously described, by selecting the Ge-based layer to have the desired material (e.g., the desired Ge concentration and/or alloying with Si, C, and/or Sn) and achieving a desired relaxation percentage, the Ge-based layer can provide a template/seeding layer from which to grow the multiple different channel material layers, such that a first channel material used for p-channel transistors may have a relatively higher lattice constant than the template surface to achieve compressive strain and a second channel material used for n-channel transistors may have a relatively lower lattice constant than the template surface to achieve tensile strain. By way of example, employing a Ge-based layer of $Si_{0.7}Ge_{0.3}$ enables the formation of fully-strained (with compressive strain) $Si_{0.4}Ge_{0.6}$ p-channel material on that $Si_{0.7}Ge_{0.3}$ layer, while also allowing for the formation of fully-strained (with tensile strain) Si n-channel material. In such an example, if the $Si_{0.4}Ge_{0.6}$ p-channel material were instead formed on the Si substrate, that $Si_{0.4}Ge_{0.6}$ p-channel material would relax (at least in part) due to the lattice mismatch between Si and $Si_{0.4}Ge_{0.6}$. Such relaxation caused by the lattice mismatch in the example case (where the techniques described herein are not employed) is undesirable, as it leads to a decrease in charge carrier mobility and thereby degrades the overall performance of the device. Further, if the Si n-channel material were instead formed on the Si substrate, the lattice parameters would be exactly matched, and thus, strain would not be produced in the first instance in that Si n-channel material.

In some embodiments, the techniques described herein can be used to benefit n-channel devices (e.g., NMOS) and/or p-channel devices (e.g., PMOS). Further, in some embodiments, the techniques described herein can be used to benefit MOSFET devices, tunnel FET (TFET) devices, Fermi filter FET (FFFET) devices, and/or any other suitable devices as will be apparent in light of this disclosure. Further still, in some embodiments, the techniques described herein can be used to form complementary transistor circuits (such as CMOS circuits), where the techniques can be used to benefit one or more of the included n-channel and p-channel transistors making up the CMOS circuit. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices. In general, the techniques allow transistors to be further scaled with diverse channel materials, while ensuring lower leakage, higher drive currents, and thereby improved performance.

Note that, as used herein, the expression "X includes at least one of A or B" refers to an X that may include, for example, just A only, just B only, or both A and B. To this end, an X that includes at least one of A or B is not to be understood as an X that requires each of A and B, unless expressly so stated. For instance, the expression "X includes A and B" refers to an X that expressly includes both A and B. Moreover, this is true for any number of items greater than two, where "at least one of" those items is included in X. For example, as used herein, the expression "X includes at least one of A, B, or C" refers to an X that may include just A only, just B only, just C only, only A and B (and not C), only A and C (and not B), only B and C (and not A), or each of A, B, and C. This is true even if any of A, B, or C happens to include multiple types or variations. To this end, an X that includes at least one of A, B, or C is not to be understood as an X that requires each of A, B, and C, unless expressly so stated. For instance, the expression "X includes A, B, and C" refers to an X that expressly includes each of A, B, and C. Likewise, the expression "X included in at least one of A or B" refers to an X that may be included, for example, in just A only, in just B only, or in both A and B. The above discussion with respect to "X includes at least one of A or B" equally applies here, as will be appreciated.

Use of the techniques and structures provided herein may be detectable using tools such as: electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate an integrated circuit (IC) including a modified Si substrate that includes a relatively thin and relaxed Ge-based layer formed thereon. In some such embodiments, the Si substrate modification may be either a deposited layer that is either the same or different in composition to the overlying Ge-based layer or an implanted layer on the Si substrate implanted with one or more of the following species: Si, C, Ge, H, He, P, B, As, Sb, Sn, In, Ga, and/or Ar.

Further, in some such embodiments, the modified substrate layer may be characterized by the nucleation of defects (e.g., dislocations and stacking faults) which predominantly terminate within the substrate and/or within the bottom portion of the Ge-based layer, rather than running through to the top of the Ge-based layer, which may be identified through high resolution TEM imagining, for instance. Thus, at least the top portion of the thin (e.g., at most 500, 450, 400, 350, 300, 250, or 200 nm), relaxed (e.g., having an actual lattice constant that is within 50, 40, 30, 20, or 10% of its bulk material fully relaxed lattice constant), Ge-based (e.g., SiGe or Ge with or without Sn and/or C alloying) layer may include relatively less defects (e.g., a defect density of at most 1E9, 5E8, 1E8, 5E7, 1E7, 5E6, 1E6, 5E5, 1E5, 5E4, or 1E4 per square cm) than if the substrate modification layer were not employed. The substrate modification and Ge-based layers may be identified via SIMS, TEM, EDX mapping, and/or atom probe tomography, for example. There could also be signatures of long range implant damage below the Ge-based layer measured via TEM imaging that is indicative of ion implantation processing at the substrate interface, for example. In some embodiments, the techniques described herein may be detected based on the benefits derived from their use, which includes diverse channel materials (particularly diverse and fully strained channel materials), relatively lower leakage, relatively higher drive currents (e.g., as a result of the strain achievable in the channel region which increases channel mobility), and/or other improved device performance. Numerous configurations and variations will be apparent in light of this disclosure.

Architecture and Methodology

FIG. 1 illustrates method 100 of forming an integrated circuit (IC) including a modified silicon substrate that enables formation of a thin, relaxed, Ge-based layer, in accordance with some embodiments of the present disclosure. FIGS. 2A-D and 3A-J illustrate example IC structures formed when carrying out method 100 of FIG. 1, in accordance with some embodiments of the present disclosure. Note that the techniques and structures described herein are primarily depicted and described in the context of forming finned or FinFET transistor configurations (e.g., tri-gate transistor configurations), for ease of illustration. However, in some embodiments, the techniques may be used to form transistors of any suitable geometry or configuration, as will be apparent in light of this disclosure. Also note that the techniques for forming the finned structures used in the channel region of one or more transistors may include blanket deposition techniques (e.g., using processes 102-110 to form structures 2A-D and 3E), replacement fin techniques (e.g., to form structures 3A-D), and/or any other suitable techniques as will be apparent in light of this disclosure. Further note that method 100 includes a primary path that illustrates a gate last transistor fabrication process flow (e.g., a replacement gate process flow), which is utilized in some embodiments. However, in other embodiments, a gate first process flow may be used, as will be described herein (and which is illustrated with the alternative gate first flow 100' indicator in FIG. 1). Numerous variations and configurations will be apparent in light of this disclosure.

A multitude of different transistor devices can benefit from the techniques described herein, which includes, but is not limited to, various field-effect transistors (FETs), such as metal-oxide-semiconductor FETs (MOSFETs), tunnel FETs (TFETs), and Fermi filter FETs (FFFETs) (also known as tunnel source MOSFETs), to name a few examples. For example, the techniques may be used to benefit an n-channel MOSFET (NMOS) device, which may include a source-channel-drain scheme of n-p-n or n-i-n, where 'n' indicates n-type doped semiconductor material, 'p' indicates p-type doped semiconductor material, and 'i' indicates intrinsic/undoped semiconductor material (which may also include nominally undoped semiconductor material, including dopant concentrations of less than 1E16 atoms per cubic centimeter (cm), for example), in accordance with some embodiments. In another example, the techniques may be used to benefit a p-channel MOSFET (PMOS) device, which may include a source-channel-drain scheme of p-n-p or p-i-p, in accordance with some embodiments. In yet another example, the techniques may be used to benefit a TFET device, which may include a source-channel-drain scheme of p-i-n or n-i-p, in accordance with some embodiments. In still another example, the techniques may be used to benefit a FFFET device, which may include a source-channel-drain scheme of np-i-p (or np-n-p) or pn-i-n (or pn-p-n), in accordance with some embodiments.

Figure 3C:
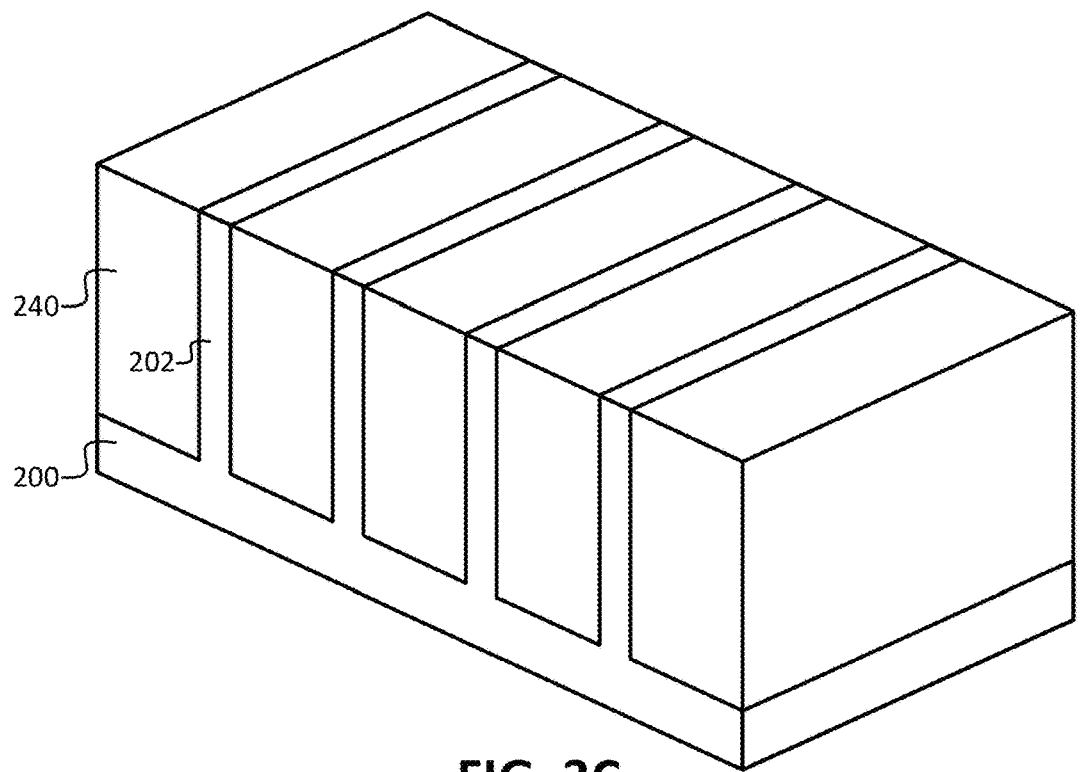
Figure 3D:
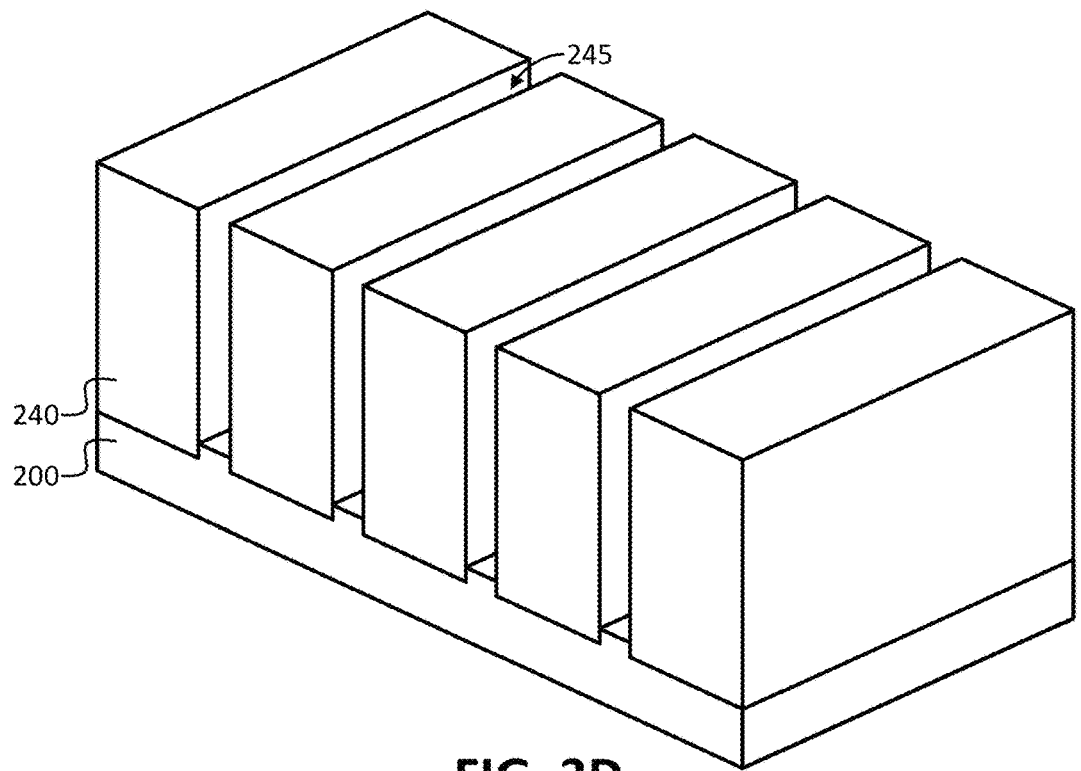

In addition, in some embodiments, the techniques may be used to benefit transistors including a multitude of configurations, such as planar and/or non-planar configurations, where the non-planar configurations may include finned or FinFET configurations (e.g., dual-gate or tri-gate), gate-all-around (GAA) configurations (e.g., nanowire or nanoribbon), or some combination thereof (e.g., a beaded-fin configurations), to provide a few examples. For instance, FIG. 3I illustrates an example IC structure including transistors having finned and nanowire configurations, as will be described in more detail below. Further, the techniques may be used to benefit complementary transistor circuits, such as complementary MOS (CMOS) circuits, where the techniques may be used to benefit one or more of the included n-channel and/or p-channel transistors making up the CMOS circuit. Other example transistor devices that can benefit from the techniques described herein include few to single electron quantum transistor devices, in accordance with some embodiments. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Figure 2A:
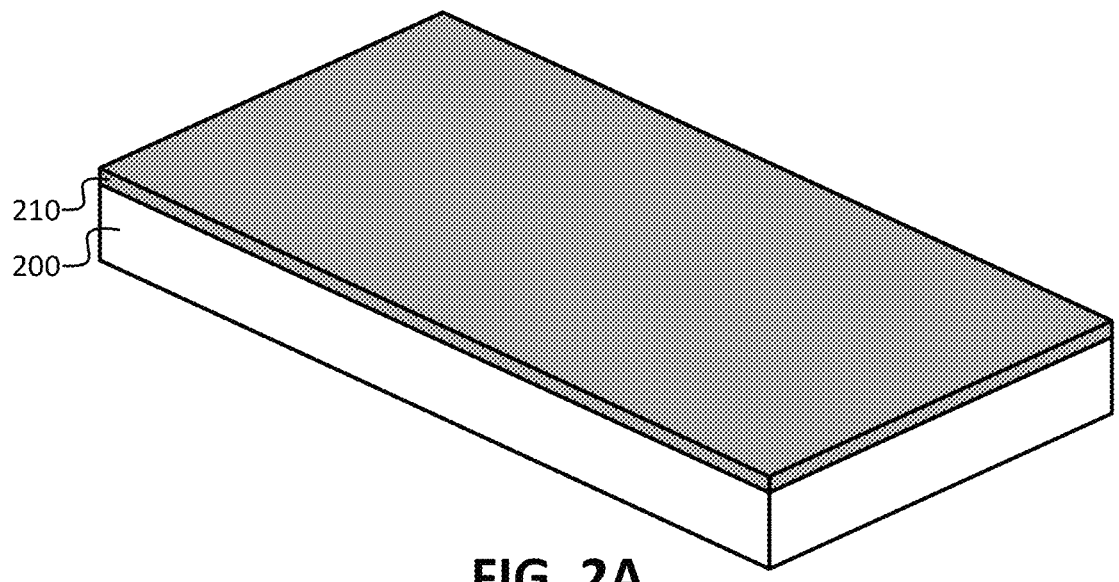

Method 100 of FIG. 1 includes modifying 102 a Si substrate 200 to form the example resulting structure of FIG. 2A, in accordance with some embodiments. In some embodiments, the modification of substrate 200 may be performed by depositing modification layer 210 on the top surface of substrate 200 and/or by implanting chemical species into the top surface of substrate 200 to form modification layer 210. In embodiments where the modification layer 210 is deposited/epitaxially grown on substrate 200, the processing may include any suitable techniques, such as chemical vapor deposition (CVD), physical vapor deposition (PVD), atomic layer deposition (ALD), vapor-phase epitaxy (VPE), molecular-beam epitaxy (MBE), liquid-phase epitaxy (LPE), spin-on processing, and/or any other suitable process. In such embodiments, the modification layer 210 would not be native to substrate 200, as it is a separate layer formed on the substrate 200. However, in some such embodiments, it may appear as though modification layer 210 is native to substrate 200, particularly where modification layer 210 includes Si, for example. In embodiments where the modification layer 210 is formed via implantation, the processing may include any suitable techniques, such as ion implantation and/or any other suitable processing. In such embodiments, the modification layer 210 would be native to substrate 200, as the processing includes modifying a top portion of the substrate 200 by driving chemical species into the top surface of the substrate 200. Thus, in some such embodiments, the implantation processing may be detected by signatures of long range implant damage at/near the top surface of substrate 200. In any such embodiments, planarization and/or polishing processing may be performed on the top surface of modification layer 210, such as a chemical mechanical polish/planarization (CMP), for example.

Substrate 200, in some embodiments may include a bulk Si substrate (e.g., a bulk Si wafer), a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, substrate 200 may be doped with any suitable n-type and/or p-type dopant at a dopant concentration in the range of 1E16 to 1E22 atoms per cubic cm, for example. For instance, the Si of substrate 200 may be p-type doped using a suitable acceptor (e.g., boron) or n-type doped using a suitable donor (e.g., phosphorous, arsenic) with a doping concentration of at least 1E16 atoms per cubic cm. However, in some embodiments, substrate 200 may be undoped/intrinsic or relatively minimally doped (such as including a dopant concentration of less than 1E16 atoms per cubic cm), for example. In general, although substrate 200 is referred to herein as a Si substrate, in some embodiments, it may essentially consist of Si, while in other embodiments, the substrate may primarily include Si but may also include other material (e.g., dopant at a given concentration). Also note that the substrate 200 may include relatively high quality or device quality monocrystalline Si that provides a suitable template/seeding surface from which other monocrystalline semiconductor material features and layers can be formed. Therefore, unless otherwise explicitly stated, a Si substrate as described herein is not intended to be limited to a substrate that only includes Si.

In some embodiments, substrate 200 may include a surface crystalline orientation described by a Miller index of (100), (110), or (111), or its equivalents, as will be apparent in light of this disclosure. Although substrate 200, in this example embodiment, is shown as having a thickness (dimension in the Y-axis direction) similar to other layers in the figures for ease of illustration, in some instances, substrate 200 may be relatively much thicker than the other layers, such as having a thickness in the range of 1 to 950 microns (or in the sub-range of 20 to 800 microns), for example, or any other suitable thickness value or range as will be apparent in light of this disclosure. In some embodiments, substrate 200 may include a multilayer structure including two or more distinct layers (that may or may not be compositionally different). In some embodiments, substrate 200 may include grading (e.g., increasing and/or decreasing) of one or more material concentrations throughout at least a portion of the substrate 200. In some embodiments, substrate 200 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Modification layer 210, in some embodiments, may include any suitable material, such as monocrystalline semiconductor material that includes at least one of silicon (Si), germanium (Ge), carbon (C), tin (Sn), hydrogen (H), helium (He), phosphorous (P), boron (B), arsenic (As), antimony (Sb), indium (In), gallium (Ga), argon (Ar), and/or nitrogen (N), to name a few examples. In some embodiments, the modification layer 210 may include compositionally different semiconductor material than Si substrate 200, particularly where modification layer 210 is a distinct layer deposited on substrate 200. For instance, in some such embodiments, a deposited modification layer 210 may include a compositionally different group IV semiconductor material, such as SiGe or Ge, which may or may not include alloying with tin (Sn) and/or carbon (C). Regardless of how the modification layer 210 is formed, it can be characterized by the nucleation of defects (e.g., dislocations and/or stacking faults) which predominantly terminate within the substrate or in the bottom portion of Ge-based layer 220, rather than running through to the top portion of the Ge-based layer 220. Therefore, in some embodiments, the modification layer 210 may primarily appear as defects due to the interface processing that occurs between substrate 200 and Ge-based layer 220 (which can be identified using TEM imaging), for example. In some embodiments, modification layer 210 may include a multilayer structure including two or more distinct layers (that may or may not be compositionally different). In some embodiments, modification layer 210 may include grading (e.g., increasing and/or decreasing) of one or more material concentrations throughout at least a portion of the layer. In some embodiments, the modification layer 210 (whether deposited and/or implanted) may have a vertical thickness (dimension in the Y-axis direction) in the range of 2-100 nm (or in a subrange of 2-25, 2-50, 2-75, 3-25, 3-50, 3-100, 5-25, 5-50, 5-100, 10-25, 10-50, 10-100, 25-50, or 25-100 nm) and/or it may have a maximum vertical thickness of at most 100, 75, 50, 40, 30, 25, 20, 15, 10, or 5 nm, for example. Other suitable materials and thickness values/ranges/thresholds will be apparent in light of this disclosure.

Figure 2B:
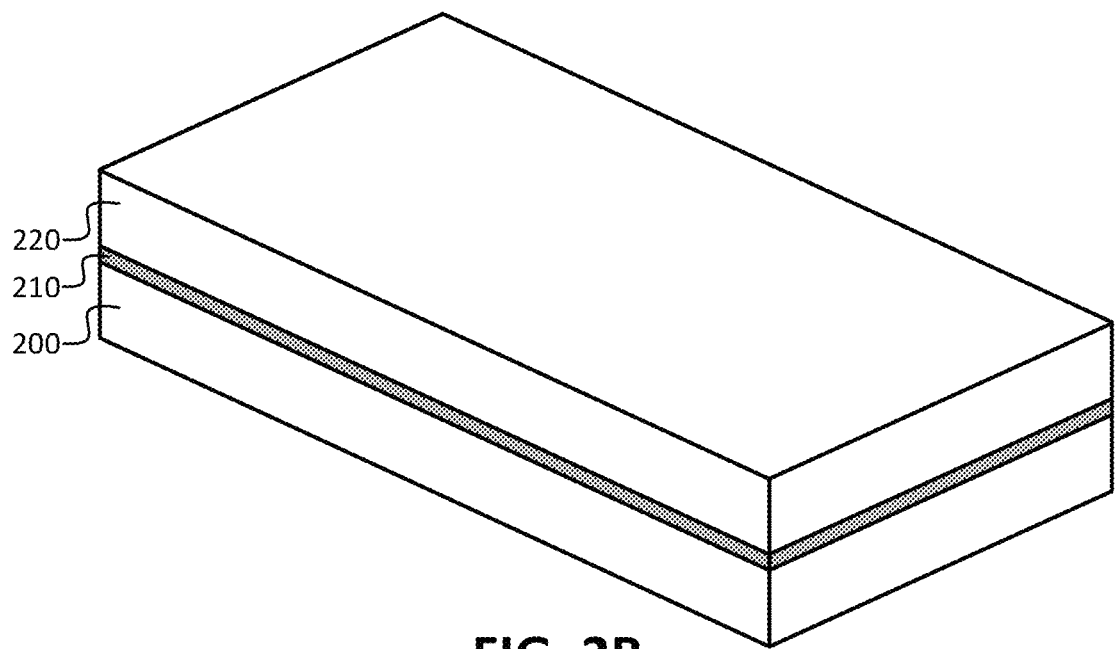

Method 100 of FIG. 1 continues with forming 104 a relaxed, thin Ge-based layer 220 (referred to simply as a Ge-based layer) on the modified substrate structure of FIG. 2A to form the example resulting structure of FIG. 2B, in accordance with some embodiments. In some embodiments, the Ge-based layer 220 may be formed using any suitable processing, such as one or more of the aforementioned deposition/epitaxial growth processes (e.g., CVD, PVD, ALD, VPE, MBE, LPE) and/or any other suitable processing, as can be understood based on this disclosure. The Ge-based layer 220, in some embodiments, may include SiGe or Ge that may or may not be alloyed with tin (Sn) and/or carbon (C). In other words, in some such embodiments, Ge-based layer 220 is a monocrystalline group IV semiconductor material that at least includes germanium. In some embodiments, the Ge-based layer 220 may or may not be doped with any suitable dopant (e.g., boron, phosphorous, and/or arsenic). In embodiments where the Ge-based layer 220 is doped, it may be n-type doped (e.g., with phosphorous or arsenic) or p-type doped (e.g., with boron) at a dopant concentration in the range of 1E16 to 1E22 atoms per cubic cm, for example. In some embodiments, Ge-based layer 220 may include a multilayer structure including two or more distinct layers (that may or may not be compositionally different). In some embodiments, Ge-based layer 220 may include grading (e.g., increasing and/or decreasing) of one or more material concentrations throughout at least a portion of the layer. In some embodiments, the Ge-based layer 220 may include a vertical thickness (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. Other suitable materials and thickness values/ranges/thresholds will be apparent in light of this disclosure.

By forming the Ge-based layer 220 on the modification layer 210, the Ge-based layer 220 can relax, at least in part, depending on the particular configuration. For instance, in some embodiments, the Ge-based layer 220 may relax to within 50, 45, 40, 35, 30, 25, 20, 15, 10, or 5% of its bulk lattice parameters, for example. By way of example, if the Ge-based layer 220 is a Ge layer, which has a lattice constant of 5.658 Å at 300 K, and it is formed on a Si substrate, which has a lattice constant of 5.431 Å at 300 K, and that Ge layer were relaxed to within 50% of its bulk lattice constant, then it would have a lattice constant in the range of approximately 5.545-5.659 Å at 300 K (which can be measured using TEM). By way of another example, if the Ge-based layer 220 is a SiGe layer having a concentration of 30% Ge, which has a lattice constant of approximately 5.499 Å at 300 K, and it is formed on a Si substrate with a relaxation value to within 20% of its bulk lattice parameters, then that $Si_{0.7}Ge_{0.3}$ Ge-based layer would have a lattice constant of approximately 5.485-5.499 Å at 300 K. In some embodiments, the Ge-based layer 220 may essentially relax completely, such that the Ge-based layer 220 has a lattice constant value that is approximately the same as the bulk/unstrained lattice constant value of the material of Ge-based layer 220, for example. In some embodiments, the Ge-based layer 220 may have an actual lattice constant that is greater or lesser than the bulk lattice constant of the material of modification layer 210. Note that in some embodiments, the relaxation of the Ge-based layer may be measured in a top portion near the top surface, which may be the relevant portion as it may be used as the template/seeding surface from which subsequently strained transistor channel material is formed.

In some embodiments, the Ge-based layer 220 may be included, at least in part, in the channel region of one or more transistor devices. In some such embodiments, at least a portion of the Ge-based layer 220 may make up the entirety of a given transistor's channel region, while in other embodiments, the Ge-based layer 220 may make up only a portion of a given transistor's channel region, where subsequently formed channel material makes up the rest of the channel region, for example. In still other embodiments, the Ge-based layer 220 may be completely below the channel region of a given transistor, where it is completely contained in a sub-channel or sub-fin region, for example. In some such embodiments, the Ge-based layer 220 can be used as a template or a seeding layer from which to form various different channel material layers, as will be described in more detail below. Further, in some such embodiments, the Ge-based layer 220 may be oppositely type doped relative to the overlying channel material layer 230 to provide a tunnel diode configuration to help reduce or eliminate parasitic leakage (e.g., subthreshold leakage). For instance, in some embodiments, the Ge-based layer 220 may be intentionally p-type doped (e.g., with a doping concentration of at least 1E16, 5E16, 1E17, 5E17, 1E18, 5E18, or 1E19 atoms per cubic cm) if the overlying channel material layer 230 is to be n-type doped, or vice versa, where the Ge-based layer 220 may be intentionally n-type doped (e.g., with a doping concentration of at least 1E16, 5E16, 1E17, 5E17, 1E18, 5E18, or 1E19 atoms per cubic cm) if the overlying channel material layer 230 is to be p-type doped.

Method 100 of FIG. 1 optionally continues with forming 106 one or more channel material layers on Ge-based layer 220, in accordance with some embodiments. In some embodiments, a channel layer need not be formed on Ge-based layer 220, as the Ge-based layer 220 itself may be used in the channel region of one or more transistors, for example. Thus, in some such embodiments, only the Ge-based layer 220 may be used in the channel region of a given transistor formed using the techniques described herein. However, in other embodiments, process 106 may be performed, such as forming channel material layer 230 on Ge-based layer 220 to form the example resulting structure of FIG. 2C, in accordance with some embodiments. In some embodiments, channel material layer 230 may be formed 106 using any suitable processes, such as one of the aforementioned techniques (e.g., CVD, PVD, ALD, VPE, MBE, LPE) and/or any other suitable processing. In some embodiments, channel material layer 230 may include any suitable semiconductor material, such as monocrystalline group IV and/or group III-V semiconductor material, for example. Recall that the use of "group IV semiconductor material" (or "group IV material" or generally, "IV") herein includes at least one group IV element (e.g., silicon, germanium, carbon, tin), such as silicon (Si), germanium (Ge), silicon germanium (SiGe), and so forth. Also recall that the use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), and so forth.

Note that group III may also be known as the boron group or IUPAC group 13, group IV may also be known as the carbon group or IUPAC group 14, and group V may also be known as the nitrogen family or IUPAC group 15, for example.

Thus, channel material layer 230, where present may include at least one of silicon, germanium, gallium, arsenide, indium, and/or aluminum. In some embodiments, the channel material layer 230 may be doped (e.g., with any suitable n-type or p-type dopant) at a dopant concentration in the range of 1E16 to 1E22 atoms per cubic cm, for example. For example, in the case of group IV semiconductor materials, the group IV material may be p-type doped using a suitable acceptor (e.g., boron) or n-type doped using a suitable donor (e.g., phosphorous, arsenic). In another example, in the case of group III-V semiconductor material, the group III-V material may be p-type doped using a suitable acceptor (e.g., beryllium, zinc) or n-type doped using a suitable donor (e.g., silicon). In other embodiments, the channel material layer may be intrinsic/undoped (or nominally undoped, with a dopant concentration less than 1E16 atoms per cubic cm), depending on the particular configuration. Further, in some embodiments, a sacrificial channel material layer may be formed at this stage of the processing, where the sacrificial channel material layer may be later removed and replaced with final channel material layer. Such a sacrificial channel material layer may be employed in embodiments where multiple channel material layers are formed, for example. Note that although layer 230 is referred to herein as a channel material layer, transistor channel regions formed using the techniques disclosed herein may not include the channel material layer 230 (e.g., where only Ge-based layer 220 is present in the channel region), may only include the channel material layer 230 (such as is the case of the right-most transistor structure including finned channel region 230 in FIG. 3I), or may include the channel material layer 230 and other suitable material (e.g., the Ge-based layer 220 and/or other semiconductor material), for example.

In some embodiments, channel material layer 230 may include a multilayer structure that includes two or more distinct layers (that may or may not be compositionally different). In some such embodiments, the channel material layer may be formed using a layer-by-layer epitaxial growth approach (e.g., using an MBE process), such that the channel material layer may or may not appear to have distinct interfaces within the layer, depending on the particular configuration and observation level. In embodiments where a nanowire (or nanoribbon or GAA) transistor is to be formed from the channel material layer, it may include at least one channel layer and at least one sacrificial layer to be removed to release the channel layer to enable forming that nanowire transistor, as will be described in more detail herein (e.g., with respect to FIG. 3I). For instance, in an example embodiment, a given channel material layer may include alternating layers of group IV and group III-V semiconductor material, where either the group IV or group III-V material is sacrificial, to enable the formation of one or more nanowires (e.g., where the sacrificial material is subsequently removed, such as during replacement gate processing). In some embodiments, channel material layer 230 may include grading (e.g., increasing and/or decreasing) of the concentration of one or more materials within the feature, such as the grading of a semiconductor material component concentration and/or the grading of the dopant concentration, for example. For instance, the grading may occur as the material of layer 230 is epitaxially grown (e.g., in the Y-axis direction). In some embodiments, a given channel material layer 230 may include a vertical thickness (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical thickness of at most 500, 450, 400, 350, 300, 250, 200, 150, 100, or 50 nm, for example. Other suitable materials and thickness values/ranges/thresholds will be apparent in light of this disclosure.

In some embodiments, multiple different channel material layers may be formed on different areas of the Ge-based layer 220, such as for CMOS applications, for example. For instance, a first channel material layer may be formed on a first area of the Ge-based layer to be used for one or more p-channel transistor devices (e.g., one or more PMOS devices) and a second channel material may be formed on a second area of the Ge-based layer to be used for one or more n-channel transistor devices (e.g., one or more NMOS devices). By selecting the Ge-based layer 220 to have the desired material (e.g., the desired Ge concentration and/or alloying with Si, C, and/or Sn) and achieving a desired relaxation percentage, the Ge-based layer 220 can provide a template/seeding layer from which to grow the multiple different channel material layers, such that a first channel material used for p-channel transistors may have a relatively higher lattice constant than the template surface to achieve tensile strain and a second channel material used for n-channel transistors may have a relatively lower lattice constant than the template surface to achieve compressive strain. For instance, in some such embodiments, the first channel material layer may include SiGe or Ge such that the Ge-based layer 220 has at least 5, 10, 15, 20, 25, 30, 35, or 40% less Ge concentration by atomic percentage relative to the first channel material layer. Further, in some such embodiments, the second channel material layer may include SiGe or Si such that the Ge-based layer 220 has at least 5, 10, 15, 20, 25, 30, 35, or 40% more Ge concentration by atomic percentage relative to the second channel material layer.

In general, the Ge-based layer 220 and a given channel material layer 230 may have a difference in Ge concentration by atomic percentage in the range of 0-100%. In some embodiments employing multiple different channel material layers, the first channel material layer may include group IV semiconductor material (e.g., Si, SiGe, Ge, etc.) and the second channel material layer may include group III-V semiconductor material (e.g., GaAs, InGaAs, InP, etc.). Recall that, in general, a given channel material layer may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel material layers may be formed using any suitable techniques, such as masking, depositing, and removing the masking as desired to form any number of compositionally different channel material layers. Further note that formation of multiple different channel material layers may include 2-5 or more compositionally different layers formed on the Ge-based layer 220, in accordance with some embodiments. In some embodiments, a given channel material layer 230 may be strained to the underlying Ge-based layer 220 such that the in-plane lattice parameters of the channel material layer are within 50, 45, 40, 35, 30, 25, 20, 15, 10, or 5%, or essentially the same as, the in-plane lattice parameter at/near the top surface of the Ge-based layer 220. Further, the strain may extend to essentially the top surface of the channel material layer 230, such that the channel material layer 230 is fully strained, in accordance with some embodiments. However, in other embodiments, a given channel material layer 230 may be essentially relaxed or at least relaxed in part (e.g., to within 50% of its material lattice constant). Where employed, numerous different channel material layer configurations and variations will be apparent in light of this disclosure.

Method 100 of FIG. 1 continues with patterning 108 the channel region material into fins to form the example resulting structure of FIG. 2D, in accordance with some embodiments. In some embodiments, patterning 108 may be performed using any suitable techniques, such as including one or more masking, patterning, lithography, and/or etching (e.g., wet and/or dry etching) processes, as can be understood based on this disclosure. For instance, the regions of the structure of FIG. 2C to be formed into fins may be masked off, followed by etch processing to form trenches 235 between each of the fin-shaped structures of FIG. 2D, for example. Note that the depth of the etch processing used to form the fins may vary and that such etch processing may be referred to as a shallow trench recess (STR) etch. For instance, as shown in FIG. 2D, the etch processing resulted in trenches 235 extending all the way down into substrate 200, such that each fin includes a stack, from bottom to top (in the Y-axis direction) of substrate 200 material, modification layer 210 material, Ge-based layer 220 material, and channel material layer 230 material, in this example embodiment. However, in other embodiments, the etch processing may go farther down (e.g., such that trenches 235 may extend deeper into substrate 200) or the etch processing may not extend as far down as it did in FIG. 2D. For example, FIG. 2D' illustrates a blown-out portion of FIG. 2D showing an alternative patterning process where the etch processing stops at the modification layer 210, in accordance with some embodiments. As can be understood based on FIG. 2D', the modification layer 210 is not a part of the fins that were formed, but instead remains as a blanket layer on substrate 200 while only channel material layer 230 and Ge-based layer 220 were formed into a fin as shown. In some embodiments, the etch processing may stop above the bottom surface of Ge-based layer 220 and may even stop above the bottom surface of channel material layer 230, for example.

Note that although each of the multilayer fin-shaped structures in FIG. 2D (of which there are four shown) are shown as having the same sizes and shapes relative to one another in this example structure for ease of illustration, the present disclosure is not intended to be so limited. For example, in some embodiments, the fin-shaped structures may be formed to have varying heights Fh and/or varying widths Fw that may correspond with (or be the same as) the final desired fin heights (AFh) and fin widths (Fw) described in more detail below. For instance, in some embodiments, a given Fw (dimension in the X-axis direction) may be in the range of 2-400 nm (or in a subrange of 2-10, 2-20, 2-50, 2-100, 2-200, 4-10, 4-20, 4-50, 4-100, 4-200, 4-400, 10-20, 10-50, 10-100, 10-200, 10-400, 50-100, 50-200, 50-400, or 100-400 nm), for example, or any other suitable value or range as will be apparent in light of this disclosure. Further, in some embodiments, a given Fh (dimension in the Y-axis direction) may be in the range of 4-800 nm (or in a subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range as will be apparent in light of this disclosure. In some embodiments, the fin heights Fh may be at least 25, 50, 75, 100, 125, 150, 175, 200, 300, 400, 500, 600, 700, or 800 nm tall, or greater than any other suitable threshold height as will be apparent in light of this disclosure. In some embodiments, the height to width ratio of the fins (Fh:Fw) may be greater than 1, such as greater than 1.5, 2, 2.5, 3, 3.5, 4, 4.5, 5, 6, 7, 8, 9, or 10, or greater than any other suitable threshold ratio, as will be apparent in light of this disclosure.

As previously stated, although the fins in FIG. 2D are shown as having the same heights Fh and widths Fw, the fins may be formed to have varying heights Fh, varying widths Fw, varying vertical starting points (location in the Y-axis direction), varying shapes, and/or any other suitable variation(s) as will be apparent in light of this disclosure. Moreover, trenches 235 may be formed to have varying depths, varying widths, varying vertical starting points (location in the Y-axis direction), varying shapes, and/or any other suitable variation(s) as will be apparent in light of this disclosure. Note that although four fins are shown in the example structure of FIG. 2D for ease of illustration, any number of fins may be formed, such as one, two, three, five, ten, hundreds, thousands, millions, and so forth, as can be understood based on this disclosure. Also note that the fins are shown in FIG. 2D as having a height that is relatively greater than the thickness (dimension in the Y-axis direction) of the remainder of substrate 200, for ease of illustration. However, in some embodiments, the height of the fins (shown as Fh) may be relatively much less (e.g., at least 2-10 times less) than the thickness of the remainder of substrate 200, for example.

Figure 3E:
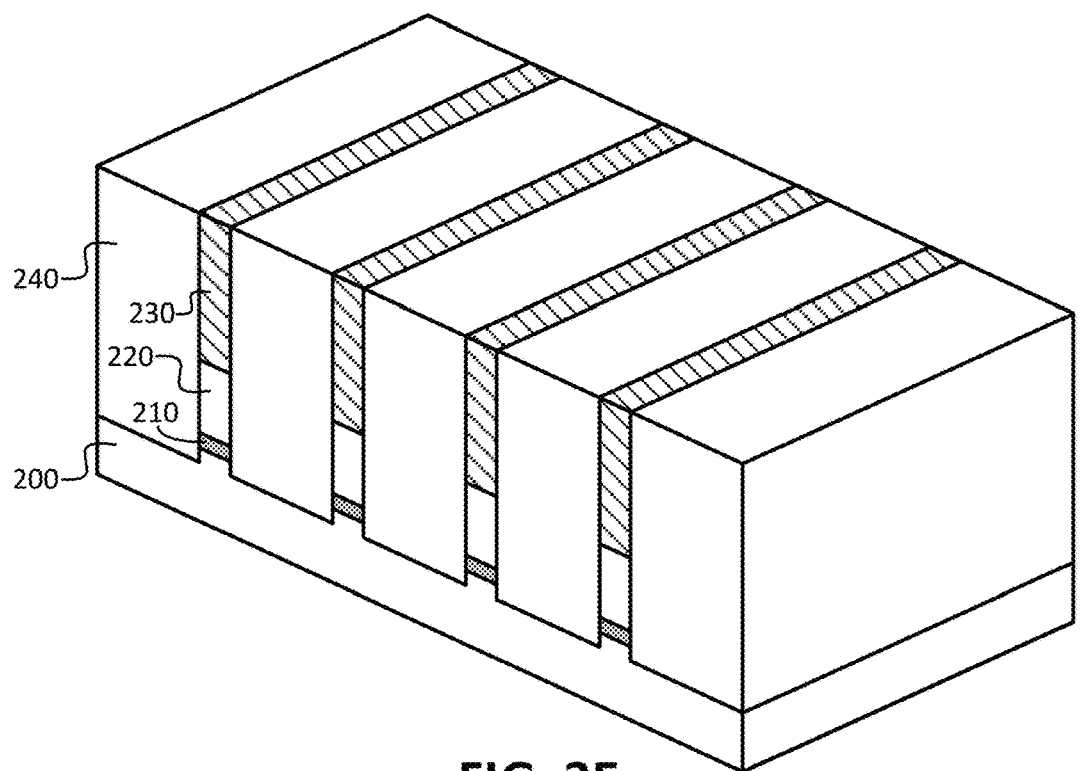

Method 100 of FIG. 1 continues with filling 110 trenches 235 between the fins of the structure of FIG. 2D with shallow trench isolation (STI) material 240, thereby forming the example resulting structure of FIG. 3E, in accordance with some embodiments. Such processing can include depositing the STI material and then optionally planarizing/polishing the structure (e.g., via CMP) to form the example structure of FIG. 3E, for example. In some embodiments, deposition of the STI material 240 may include any suitable deposition techniques, such as those described herein (e.g., CVD, ALD, PVD), or any other suitable deposition process. In some embodiments, STI material 240 (which may be referred to as an STI layer or STI regions) may include any suitable electrical insulator material, such as one or more dielectric, oxide (e.g., silicon dioxide), and/or nitride (e.g., silicon nitride) materials. In some embodiments, the material of STI layer 240 may be selected based on the material of substrate 200. For instance, the STI material may be selected from silicon dioxide or silicon nitride based on the use of a Si substrate 200, to provide some examples.

Method 100 of FIG. 1 may include an alternative replacement fin-based approach 111 for processes 102-110 to arrive at the structure of FIG. 3E, in accordance with some embodiments. For instance, FIGS. 3A-E illustrate example structures formed when carrying out the alternative replacement fin-based approach 111. Note that the previous relevant description with respect to processes 102-110 and the structures 2A-D and 3E formed therefrom is equally applicable to the alternative replacement fin-based process 111 and the structures of FIGS. 3A-E. As can be understood based on this disclosure, the replacement fin-based approach includes forming fins from the substrate, forming STI material around those fins, recessing the native-to-substrate fins to form fin-shaped trenches, and then forming replacement fins in the fin-shaped trenches. Such a replacement fin-based approach 111 to forming the structure of FIG. 3A can include providing a substrate 200 as shown in FIG. 3A. The previous relevant description with respect to substrate 200 is equally applicable here.

Replacement fin-based approach 111 continues with forming fins 202 from substrate 200 to form the example resulting structure of FIG. 3B. The previous relevant description with respect to the fins of FIG. 2D are equally applicable here, except that the fins 202 in FIG. 3B only include material native to substrate 200. Further, the previous relevant description with respect to trenches 235 is equally applicable to the trenches 205 between fins 202. Approach 111 continues with forming STI material 240 between the fins 202 to form the example resulting structure of FIG. 3C. The previous relevant description with respect to STI material 240 is equally applicable here. Approach 111 continues with recessing fins 202 to form fin-shaped trenches 245 in the example resulting structure of FIG. 3D. The recessing can be performed using any suitable techniques, such as wet and/or dry etch processing. Approach 111 continues with forming layers 210, 220, and 230 (e.g., via deposition/epitaxial growth techniques) in trenches 245 to arrive at the example resulting structure of FIG. 3E. The previous relevant description with respect to layers 210, 220, and 230 is equally applicable here, except that the layers are formed using a replacement fin-based approach 111 in this example embodiment as compared to the previously described blanket deposition approach.

Figure 3F:
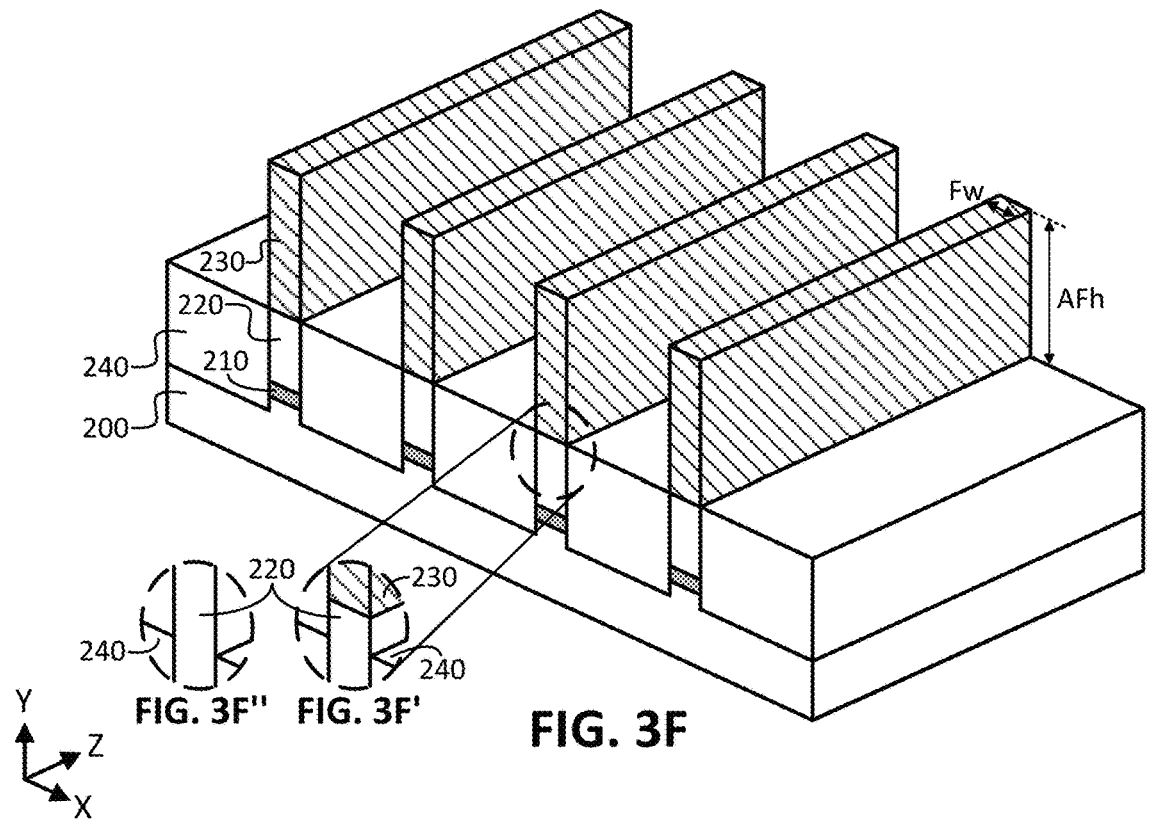
Figure 3I:
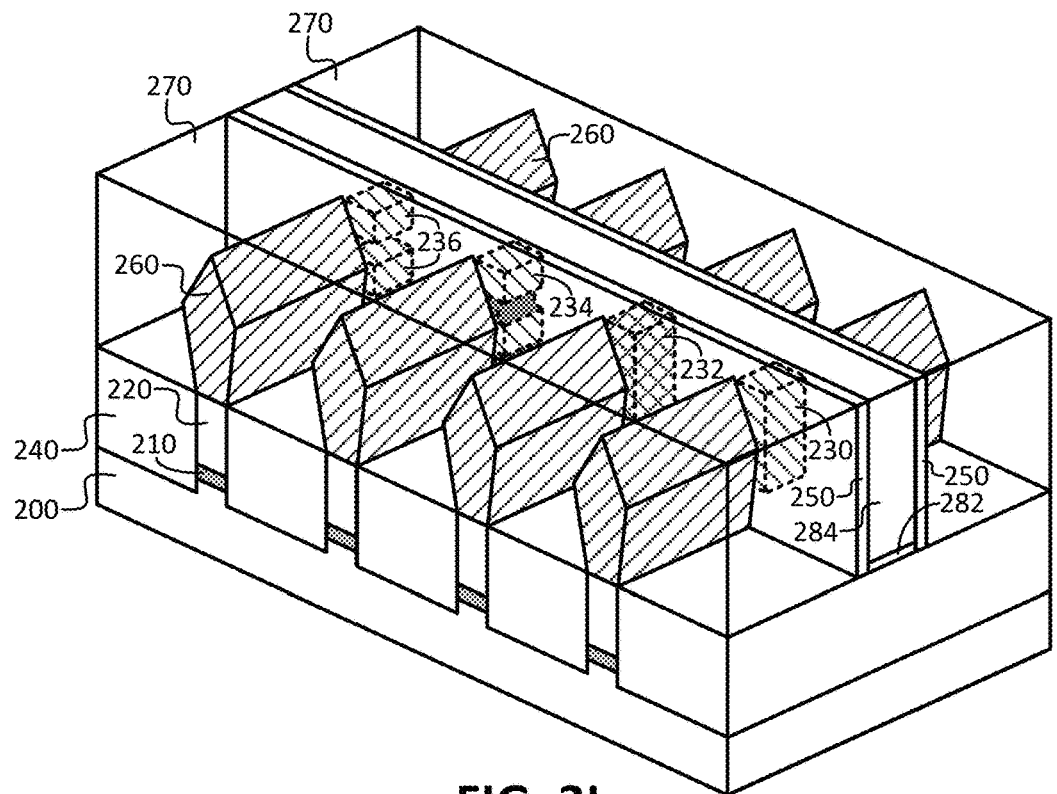

Regardless of whether a blanket deposition approach (e.g., using processes 102-110) or a replacement fin-based approach (such as approach 111 described above) is used to form the structure of FIG. 3E, method 100 of FIG. 1 can continue to box 112 which includes optionally recessing the STI material 240 to a desired level to form the example resulting structure of FIG. 3F, in accordance with some embodiments. Note that in some embodiments, recess 112 is optional and need not be performed, such as for transistors employing planar configurations, for example. For instance, in some such embodiments, transistors may be formed using the top surface of channel material layer 230, as can be understood based on this disclosure. However, in the example embodiment of FIG. 3F, STI material 240 was recessed to allow a portion of the original fins to exude above the top surface of STI material 240 as shown. In some embodiments, recessing 112, where performed, may include any suitable techniques, such as using one or more wet and/or dry etch processes that allow the STI material 240 to be selectively recessed relative to the fin material, and/or any other suitable processing as will be apparent in light of this disclosure.

In the example embodiment of FIG. 3F, the STI material 240 was recessed such that only the entirety of the channel material layer 230 portion of the fins is above the top surface of the STI material 240, as shown. Thus, the top plane of the STI material 240 is at the same level as the interface between the Ge-based layer 220 and the channel material layer 230, in this example case. As can be understood based on this disclosure, that portion of the fin that exudes above the top plane/surface of the STI material 240 may be used in the active channel region of one or more transistors, such that those fin portions may be referred to as active fin portions herein, for example. Moreover, the remaining portions of the fins extending from substrate 200 and below the top plane of STI layer 240 are may be referred to as sub-fin or sub-channel portions, for example, as that structure will be below the channel region of the subsequently formed transistor devices, in at least one IC orientation. FIG. 3F' illustrates a blown-out portion of FIG. 3F showing an alternative STI material 240 recess location, in accordance with some embodiments. As shown in FIG. 3F', the recess resulted in the top surface of the STI material 240 being below the interface between the Ge-based layer 220 and the channel material layer 230, such that a top portion of Ge-based layer 220 would be a part of the active fin height, as can be understood based on this disclosure.

Further, FIG. 3F" illustrates the blown-out portion of FIG. 3F', where the channel material layer 230 is not present such that only the Ge-based layer 220 is included in the active fin height, in accordance with some embodiments. Recall, in some embodiments, the channel material layer 230 need not be formed, such that the Ge-based layer 220 may only be used in the channel region of one or more transistors. Generally, the active fin height, indicated as AFh, may be in the range of 4-800 nm (e.g., in the subrange of 4-10, 4-20, 4-50, 4-100, 4-200, 4-400, 10-20, 10-50, 10-100, 10-200, 10-400, 10-800, 50-100, 50-200, 50-400, 50-800, 100-400, 100-800, or 400-800 nm), for example, or any other suitable value or range, as will be apparent in light of this disclosure. In some embodiments, the active fin heights AFh may be at least 25, 50, 75, 100, 125, 150, 175, 200, 300, 400, 500, 600, 700, or 800 nm tall, or greater than any other suitable threshold height as will be apparent in light of this disclosure. The previous relevant description with respect to fin width Fw is equally applicable to the active fin width (which is also indicated as Fw, as it did not change). As can be understood based on this disclosure, the active fin height is the portion of the original fins formed on substrate 200 that will be included in a transistor channel region, while the remainder of the fin, which is the portion below that active fin height, is referred to as a sub-fin or sub-channel portion. Numerous different active channel regions may be formed as will be apparent in light of this disclosure.

Method 100 of FIG. 1 continues with forming 114 the dummy or final gate stack in accordance with some embodiments. As previously described, a gate last fabrication process may utilize a dummy gate stack to allow for replacement gate processing, while a gate first fabrication process may form the final gate stack in the first instance. Continuing from the example structure of FIG. 3F, the processing is primarily described herein in the context of a gate last transistor fabrication flow, where the processing includes forming a dummy gate stack, performing the S/D processing, and then forming the final gate stack after the S/D regions have been processed. In other embodiments, the techniques may be performed using a gate first process flow. In such example embodiments, a dummy gate stack need not be formed, as the final gate stack can be formed in the first instance. However, the description of the continued processing will be described using a gate last process flow, to allow for such a gate last flow (which may include additional processing) to be adequately described. Regardless, the end structure of either a gate first or a gate last process flow will include the final gate stack, as will be apparent in light of this disclosure. In this example embodiment, the processing includes forming a dummy gate stack (which includes dummy gate dielectric 252 and dummy gate electrode 254) on the structure of FIG. 3F, thereby forming the example resulting structure of FIG. 3G, in accordance with some embodiments. Recall, the formation of the dummy gate stack is optional, because it need not be performed in all embodiments (such as those employing a gate first process flow). In this example embodiment, dummy gate dielectric 252 (e.g., dummy oxide material) and dummy gate electrode 254 (e.g., dummy poly-silicon material) may be used for a replacement gate process. Note that side-wall spacers 250, referred to generally as gate spacers (or simply, spacers), on either side of the dummy gate stack were also formed, and such spacers 250 can help determine the channel length and/or help with replacement gate processing, for example.

As can be understood based on this disclosure, the dummy gate stack (and spacers 250) help define the channel region and source/drain (S/D) regions of each fin, where the channel region is below the dummy gate stack (as it will be located below the final gate stack), and the S/D regions are on either side of and adjacent the channel region. Note that because the IC structures are being described in the context of forming finned transistors, the final gate stack will also be adjacent to either side of the fin, as the gate stack will reside along three walls of the finned channel regions and/or wrap around the active fin portion from one region of STI material 240 to another region of STI material, in some such embodiments. Formation of the dummy gate stack may include depositing the dummy gate dielectric material 252 and dummy gate electrode material 254, patterning the dummy gate stack, depositing gate spacer material 250, and performing a spacer etch to form the structure shown in FIG. 3G, for example. Spacers 250 may include any suitable material, such as any suitable electrical insulator, dielectric, oxide (e.g., silicon oxide), and/or nitride (e.g., silicon nitride) material, as will be apparent in light of this disclosure. Note that in some embodiments, a hardmask (not shown) may be formed over the dummy gate stack (which may or may not also be formed over spacers 250) to protect the dummy gate stack during subsequent processing, for example.

Method 100 of FIG. 1 continues with performing 116 source and drain (S/D) region processing to form the example resulting structure of FIG. 3H, in accordance with some embodiments. The S/D regions 260, in some embodiments, may be formed using any suitable techniques, such as masking regions outside of the S/D regions to be processed, etching at least a portion of the exposed fins from the structure of FIG. 3G, and forming/depositing/growing the S/D regions 260 (e.g., using any suitable techniques, such as CVD, PVD, ALD, VPE, MBE, LPE), for example. However, in some embodiments, the exposed fins (which in the embodiment of FIG. 3G includes channel material layer 230) need not be completely removed, but they may remain (at least in part) in the final S/D regions and be doped, implanted, and/or clad with final S/D material and/or have any other suitable processing performed to convert them into suitable final S/D regions, for example. For instance, FIG. 3H' illustrates a blown-out portion of FIG. 3H showing an S/D region formed using a cladding scheme, in accordance with some embodiments. As shown in FIG. 3H', the final S/D material 260' was formed on the original exposed fin in that S/D location (which included channel material layer 230). In the example embodiment of FIG. 3H, as the material of the S/D regions 260 is replacement material, there is a distinct interface between the underlying sub-fin portions and S/D regions 260, as shown in FIG. 3H. In some embodiments, one or more of the S/D regions 260 may have a multilayer structure including two or more distinct layers, for example. For instance, in FFFET configurations, the source region has a bi-layer structure that includes two oppositely doped layers (e.g., one is n-type doped and the other is p-type doped), for example. In some embodiments, one or more of the S/D regions 260 may include grading (e.g., increasing and/or decreasing) the content/concentration of one or more materials in some or all of the region(s). For instance, in some embodiments, it may be desired to increase the grading as a given S/D region 260 is formed, to have a relatively lower doping concentration near the channel region and a relatively higher doping concentration near the corresponding S/D contact.

In some embodiments, the S/D regions 260 may be formed one polarity at a time, such as performing processing for one of n-type and p-type S/D regions, and then performing processing for the other of the n-type and p-type S/D regions. In some embodiments, the S/D regions may include any suitable material, such as monocrystalline group IV and/or group III-V semiconductor material and/or any other suitable semiconductor material, as will be apparent in light of this disclosure. In some embodiments, the S/D regions corresponding to a given channel region may include the same group of semiconductor material as what is included in the given channel region, such that if the given channel region includes group IV semiconductor material, the corresponding S/D regions may also include group IV semiconductor material (whether the same IV material or different); however, the present disclosure is not intended to be so limited. In some embodiments, the S/D regions may include any suitable doping scheme, such as including suitable n-type and/or p-type dopant (e.g., in a concentration in the range of 1E16 to 1E22 atoms per cubic cm). However, in some embodiments, at least one S/D region 260 may be undoped/intrinsic or relatively minimally doped, such as including a dopant concentration of less than 1E16 atoms per cubic cm, for example.

To provide some example configurations, in embodiments where corresponding S/D regions on either side of a given channel region are to be used for a MOSFET device, the S/D regions may include the same type of dopants (e.g., where both are p-type doped or both are n-type doped). Specifically, for an NMOS device, the included S/D regions include semiconductor material that is n-type doped, and for a PMOS device, the included S/D regions include semiconductor material that is p-type doped, in some embodiments. Whereas for a TFET device, the S/D regions for a given channel region may be oppositely doped, such that one is p-type doped and the other is n-type doped, in some embodiments. Note that for ease of illustration and description, all S/D regions are shown as being the same and are identified collectively by numeral 260. However, in some embodiments, the S/D regions 260 may include differing materials, dopant schemes, shapes, sizes, corresponding channel regions (e.g., 1, 2, 3, or more), and/or any other suitable difference as can be understood based on this disclosure. For instance, the S/D regions 260 of FIG. 3H includes pentagon or diamond-like shape (as viewed in the X-Y plane), while the S/D region 260' of FIG. 3H' includes a rounded or curved hill-like shape (as viewed in the X-Y plane), to provide a few examples. Further note that the shading or patterning of the features/layers of the IC structures included in FIGS. 2A-D, 3A-J, and 4 (such as S/D regions 260) is provided merely to assist in visually distinguishing those different IC features/layers. Such shading or patterning is not intended to limit the present disclosure in any manner. Numerous transistor S/D configurations and variations will be apparent in light of this disclosure.

Method 100 of FIG. 1 continues with performing 118 the final gate stack processing to form the example resulting structure of FIG. 3I, in accordance with some embodiments. As shown in FIG. 3I, the processing in this example embodiment included depositing interlayer dielectric (ILD) material 270 on the structure of FIG. 3H, followed by optional planarization and/or polishing (e.g., CMP) to reveal the dummy gate stack. Note that the ILD material 270 is shown as transparent in the example structure of FIG. 3H to allow for the underlying features to be seen (and the ILD material 270 may actually be transparent or translucent at such a small scale); however, the present disclosure is not intended to be so limited. Also note that the ILD layer 270 may include a multilayer structure, even though it is illustrated as a single layer. Further note that in some cases, ILD material 270 and STI material 240 may not include a distinct interface as shown in FIG. 3H, particularly where, e.g., the ILD layer 270 and STI material 240 include the same dielectric material. In some embodiments, the ILD layer 270 may include any suitable material, such as one or more oxides (e.g., silicon oxide), nitrides (e.g., silicon nitride), dielectrics, and/or electrically insulating material, for example.

The gate stack processing, in this example embodiment, continued with removing the dummy gate stack (including dummy gate electrode 254 and dummy gate dielectric 252) to allow for the final gate stack to be formed. Recall that in some embodiments, the formation of the final gate stack, which includes gate dielectric 282 and gate electrode 284, may be performed using a gate first fabrication flow (e.g., an up-front hi-k gate process). In such embodiments, the final gate processing may have been performed prior to the S/D processing, for example. Further, in such embodiments, process 118 need not be performed, as the final gate stack would have been formed at box 114, for example. However, in this example embodiment, the gate stack is formed using a gate last fabrication flow, which may also be considered a replacement gate or replacement metal gate (RMG) process. In such gate last processing, the process may include dummy gate oxide deposition, dummy gate electrode (e.g., poly-Si) deposition, and, optionally, patterning hardmask deposition, as previously described. Regardless of whether gate first or gate last processing is employed, the final gate stack can include gate dielectric 282 and gate electrode 284 as shown in FIG. 3H and described herein, in accordance with some embodiments.

Note that when the dummy gate is removed, the channel regions of the previously formed fins (which include channel material layer 230, in this example case) that were covered by the dummy gate are exposed to allow for any desired processing of those channel regions of the fins. Such processing of the channel regions may include various different techniques, such as removing and replacing the channel region with replacement material, doping the channel region of the fin as desired, forming the fin into one or more nanowires (or nanoribbons) for a gate-all-around (GAA) transistor configuration, forming the fin into a beaded-fin configuration, cleaning/polishing the channel region, and/or any other suitable processing as will be apparent in light of this disclosure. For instance, finned channel regions 230 and 232 are illustrated (which are the channel regions of the right-most finned structure and the second-from-the-right finned structure, respectively), where finned channel region 230 includes the channel material layer (and in other embodiments, may include at least a portion of the Ge-based layer 220, such as in the case of the structure of FIG. 3F') and the second finned channel region 232 may include any other suitable configuration. For instance, in some embodiments, second finned channel region 232 may only include the Ge-based layer 220, while in other embodiments, second finned channel region 232 may include a second channel material layer that is compositionally different from the first channel material layer 230, to provide some examples. Thus, and as was previously described, finned channel region 230 may be used for an n-channel or p-channel finned transistor device, while second finned channel region 232 may be used for the other of an n-channel or p-channel finned transistor device, in accordance with an example embodiment. Further, in such an example embodiment, both of the finned channel regions 230 and 232 may be included in a complementary transistor circuit (e.g., a CMOS circuit), for instance.

Other non-planar transistor configurations (that is, other than finned configurations, which may utilize a tri-gate or double-gate scheme) are also shown in the example structure of FIG. 3I. For instance, nanowire channel region 236 may have been formed after the dummy gate stack was removed and the channel regions were exposed, by converting an original finned structure at that location into the nanowires 236 shown using, for example, any suitable techniques. For instance, the original finned channel region may have included a multilayer structure, where one or more of the layers were sacrificial and selective etch processing was performed to remove those sacrificial layers and release the nanowires 236. As shown in FIG. 3I, nanowire channel region 236 includes 2 nanowires (or nanoribbons) in this example case. However, a nanowire (or nanoribbon or GAA) transistor formed using the techniques disclosed herein may include any number of nanowires (or nanoribbons) such as 1, 3, 4, 5, 6, 7, 8, 9, 10, or more, depending on the desired configuration. In some embodiments, a nanowire or nanoribbon may be considered fin-shaped where the gate stack wraps around each fin-shaped nanowire or nanoribbon in a GAA transistor configuration. To provide yet another example non-planar transistor configuration, beaded-fin channel region 234 is a hybrid between a finned channel region and a nanowire channel region, where the sacrificial material (shown with grey shading) that may have been completely removed to release nanowires was instead only partially removed to form the resulting beaded-fin structure 234 shown. Such a beaded-fin channel region structure may benefit from, for instance, increased gate control (e.g., compared to a finned channel region structure) while also having, for instance, relatively reduced parasitic capacitance (e.g., compared to a nanowire channel region structure). Therefore, numerous different channel region configurations can be employed using the techniques described herein, including planar and a multitude of non-planar configurations.

As can be understood based on this disclosure, the channel region may be at least below the gate stack, in some embodiments. For instance, in the case of a planar transistor configuration, the channel region may just be below the gate stack. However, in the case of a finned transistor configuration, the channel region may be below and between the gate stack, as the gate stack may be formed on three sides of the finned structure (e.g., in a tri-gate manner), as is known in the art. Further, in the case of a nanowire (or nanoribbon or GAA) transistor configuration, the gate stack may substantially (or completely) surround each nanowire/nanoribbon in the channel region (e.g., wrap around at least 80, 85, 90, or 95% of each nanowire/nanoribbon). Regardless, in some embodiments, the gate of a transistor may be proximate to the channel region of that transistor. Generally, in some embodiments, the channel region may include any suitable material, such as monocrystalline group IV and/or group III-V semiconductor material, for example. In some embodiments, the channel region of a given transistor may be doped (e.g., with any suitable n-type and/or p-type dopants) or intrinsic/undoped, depending on the particular configuration. Note that S/D regions 260 are adjacent to either side of a given channel region, as can be seen in FIG. 3I. In other words, each channel region is between corresponding S/D regions 260. Also note that the configuration/geometry of a transistor formed using the techniques described herein may primarily be described based on the shape/configuration of the respective channel region of that transistor, for example. For instance, a nanowire (or nanoribbon or GAA) transistor may be referred to as such because it includes one or more nanowires (or nanoribbons) in the channel region of that transistor, but the S/D regions need not include such a nanowire (or nanoribbon) shape.

Continuing with the example structure of FIG. 3I, after the dummy gate has been removed and any desired channel region processing has been performed, the final gate stack can be formed, in accordance with some embodiments. In this example embodiment, the final gate stack includes gate dielectric 282 and gate electrode 284, as shown in FIG. 3I. The gate dielectric 282 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, an annealing process may be carried out on the gate dielectric 282 to improve its quality when high-k dielectric material is used. The gate electrode 284 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric 282 and/or gate electrode 284 may include a multilayer structure of two or more material layers, for example. For instance, in some embodiments, a multilayer gate dielectric may be employed to provide a more gradual electric transition from the channel region to the gate electrode, for example. In some embodiments, gate dielectric 282 and/or gate electrode 284 may include grading (e.g., increasing and/or decreasing) the content/concentration of one or more materials in at least a portion of the feature(s). One or more additional layers may also be present in the final gate stack, in some embodiments, such as one or more relatively high or low work function layers and/or other suitable layers, for example. Note that although gate dielectric 282 is only shown below gate electrode 284 in the example embodiment of FIG. 3I, in other embodiments, the gate dielectric 282 may also be present on one or both sides of gate electrode 284, such that the gate dielectric 282 is between gate electrode 284 and one or both spacers 250, for example. Numerous different gate stack configurations will be apparent in light of this disclosure.

Figure 3J:
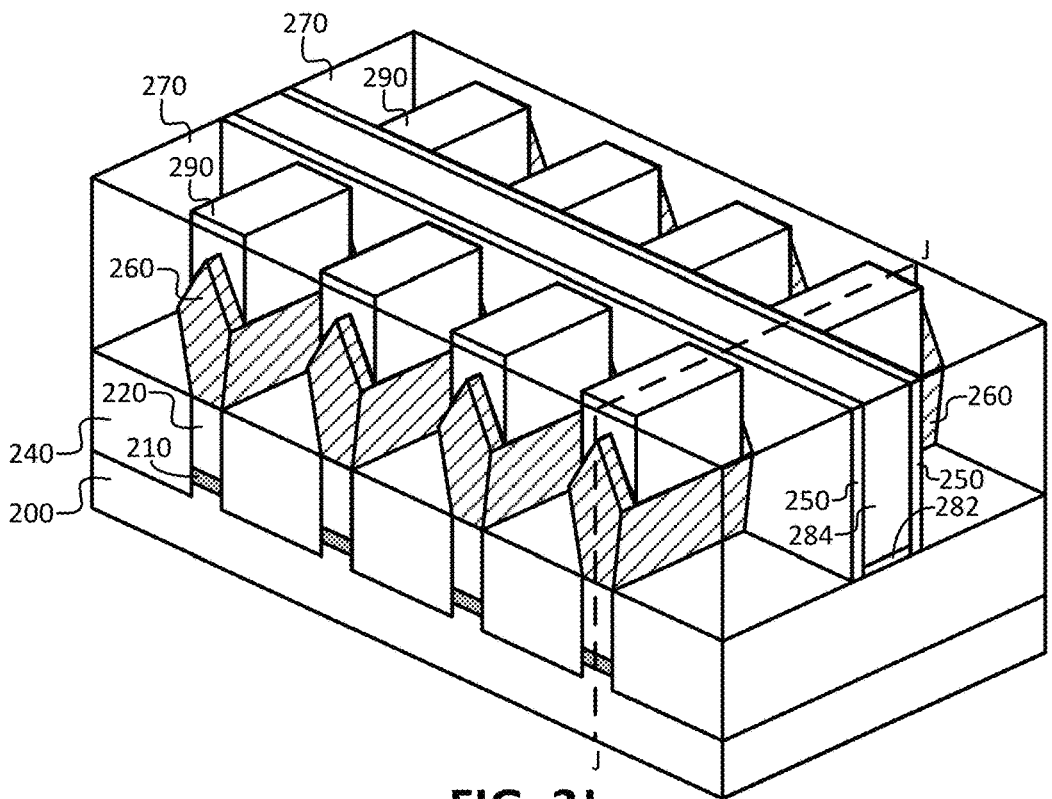

Method 100 of FIG. 1 continues with performing 120 S/D contact processing to form the example resulting structure of FIG. 3J, in accordance with some embodiments. As shown in FIG. 3J, S/D contacts 290 were formed to make contact to each of the S/D regions 260, in this example embodiment. In some embodiments, S/D contacts 290 may be formed using any suitable techniques, such as forming contact trenches in ILD layer 270 over the respective S/D regions 260 and depositing metal or metal alloy (or other suitable electrically conductive material) in the trenches. In some embodiments, S/D contact 290 formation may include silicidation, germanidation, III-V-idation, and/or annealing processes, for example. In some embodiments, S/D contacts 290 may include aluminum or tungsten, although any suitable conductive metal or alloy can be used, such as silver, nickel-platinum, or nickel-aluminum, for example. In some embodiments, one or more of the S/D contacts 290 may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the S/D contact 290 regions, such as adhesion layers (e.g., titanium nitride) and/or liner or barrier layers (e.g., tantalum nitride), if so desired. In some embodiments, a contact resistance reducing layer may be present between a given S/D region 260 and its corresponding S/D contact 290, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding S/D region, for example.

Method 100 of FIG. 1 continues with completing 122 general integrating circuit (IC) processing as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure. Note that the processes 102-122 in method 100 of FIG. 1 are shown in a particular order for ease of description. However, one or more of the processes may be performed in a different order or may not be performed at all (and thus be optional), in accordance with some embodiments. For example, processes 106, 112, and 118 may be optional in some embodiments, as previously described. Further, processes 102-110 may be alternatively performed using a replacement fin-based approach 111, in accordance with some embodiments. Numerous variations on method 100 and the techniques described herein will be apparent in light of this disclosure.

Figure 4:
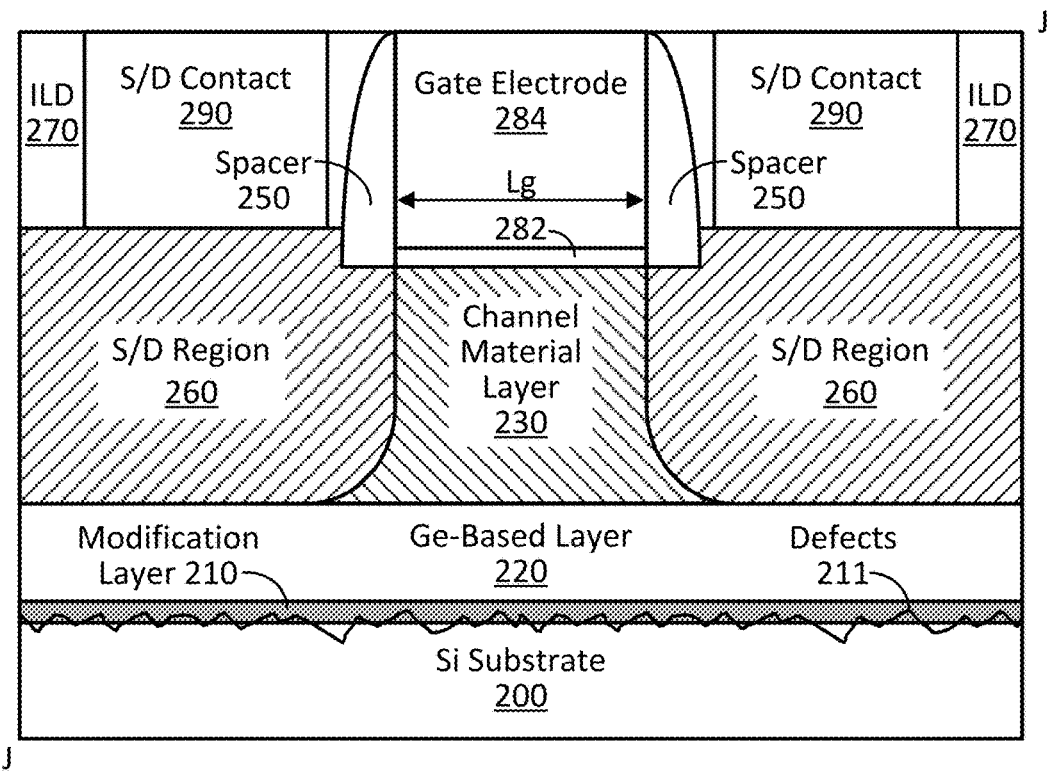
FIG. 4 illustrates an example cross-sectional view taken along the plane J-J in FIG. 3J, in accordance with some embodiments of the present disclosure.

FIG. 4 illustrates an example cross-sectional view taken along the plane J-J in FIG. 3J, in accordance with some embodiments of the present disclosure. The cross-sectional view of FIG. 4 is provided to assist in illustrating different features of the structure of FIG. 3J, for example. Therefore, the previous relevant description with respect to the each similarly numbered feature is equally applicable to FIG. 4. However, note that the dimensions of the features shown in FIG. 4 may differ in some ways (relative to the features in the structure of FIG. 3J), for ease of illustration. Also note that some variations occur between the structures, such as the shape of spacers 250 and of the finned channel region (which includes channel material layer 230, in the example embodiments), for instance. In some embodiments, the length of gate electrode 284 (e.g., the dimension between spacers 250 in the Z-axis direction), which is indicated as Lg, may be any suitable length as can be understood based on this disclosure. For instance, in some embodiments, the gate length may be in the range of 3-100 nm (e.g., 3-10, 3-20, 3-30, 3-50, 5-10, 5-20, 5-30, 5-50, 5-100, 10-20, 10-30, 10-50, 10-100, 20-30, 20-50, 20-100, or 50-100 nm), or any other suitable value or range as will be apparent in light of this disclosure. In some embodiments, the gate length may be less than a given threshold, such as less than 100, 50, 40, 30, 25, 20, 15, 10, 8, or 5 nm, or less than any other suitable threshold as will be apparent in light of this disclosure. For instance, in some embodiments, the gate length may be the same as or similar to the channel length (e.g., the gate length may be approximately longer than the channel length, such as 1-20% longer, due to potential diffusion of dopant from the S/D regions into the channel region and/or due to the use of S/D region tips that extend under the gate stack), which may also be any suitable length as can also be understood based on this disclosure. In some embodiments, the techniques enable maintaining a desired device performance when scaling to such low thresholds, such as sub-50, sub-40, sub-30, or sub-20 nm thresholds, as can be understood based on this disclosure.

Figure 5:
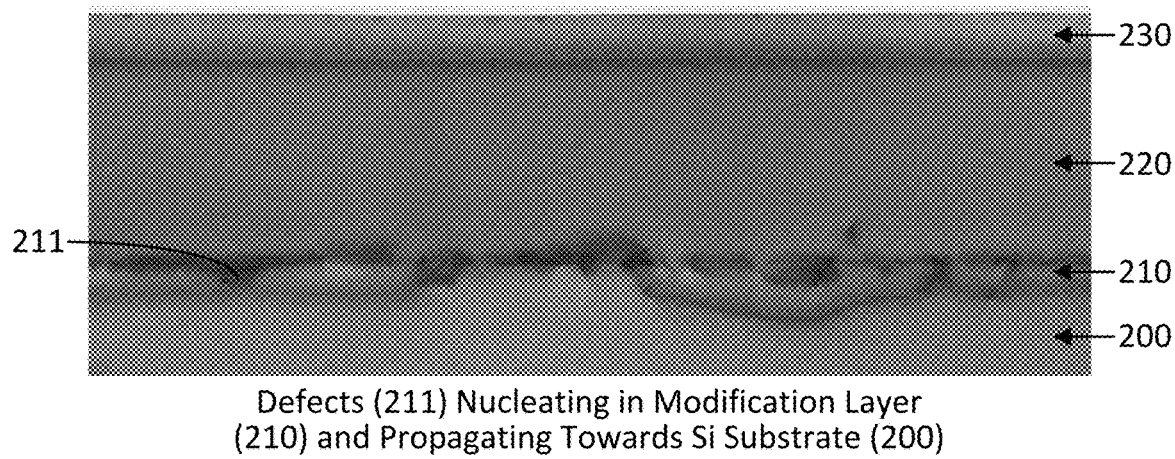
FIG. 5 is a transmission electron microscopy (TEM) image showing an example stack of layers including a Si substrate, modification layer, Ge-based layer, and channel material layer to illustrate defects nucleating in the modification layer and propagating towards the Si substrate, in accordance with some embodiments of the present disclosure.

FIG. 5 is a transmission electron microscopy (TEM) image showing an example stack of layers including Si substrate 200, modification layer 210, Ge-based layer 220, and channel material layer 230 to illustrate defects 211 nucleating in the modification layer 210 and propagating towards the Si substrate 200, in accordance with some embodiments of the present disclosure. The 200/210/220/230 stack of layers is also shown in FIG. 2C, for example. As was previously stated, in the IC stack of layers described herein, the modification layer 210 causes the formation of defects (e.g., dislocations and/or stacking faults) that mostly terminate within the Si substrate 200 or a lower portion of the Ge-based layer 220, rather than running through to the top portion/surface of the Ge-based layer 220. Therefore, the modification layer 210 allows the thin Ge-based layer 220 to relax, at least in part. An example of defects 211 are also illustrated in FIG. 4, where it can be seen that the defects nucleate or start in the modification layer and primarily (e.g., at least 50, 60, 70, 80, or 90%) or essentially completely propagate towards the Si substrate 200 and terminate therein. In some embodiments, the defects may primarily start or nucleate at 200/210 interface, within modification layer 210, or at the 210/220 interface, for example. As shown in FIG. 5, the defects may create nooks, crannies, voids, valleys, material separations, and/or other such features at the interface between the Si substrate 200 and the Ge-based layer 220, for example. As such, the modification layer 210 may not be readily apparent, but may instead primarily appear as the defects 211 that it helps create (particularly where ion implantation of the modification layer 210 is performed). Therefore, in some embodiments, the techniques described herein may be identified based on the presence of defects that are primarily trapped or contained near the interface between the Si substrate 200 and the Ge-based layer 220 (whether or not the modification layer 210 is present).

In some embodiments, the top portion/surface of the Ge-based layer 220 may have a relatively low defect or dislocation density, such as less than 1E9 per square cm, which is the typical minimum threshold defect/dislocation density that would form at the top portion/surface of the Ge-based layer 220 if the modification layer 210 were not employed. In some such embodiments, the top portion/surface of the Ge-based layer 220 may have a defect/dislocation density of at most 1E9, 5E8, 1E8, 5E7, 1E7, 5E6, 1E6, 5E5, 1E5, 5E4, or 1E4 per square cm, for example. In some embodiments, the top portion/surface of the Ge-based layer may include essentially no defects or dislocations, as they may terminate prior to reaching that top portion/surface. Note that when the top portion/surface of the Ge-based layer 220 is referred to herein, such description may pertain to the top-most surface of the Ge-based layer (e.g., the surface farthest from the Si substrate 200 and farthest from the modification layer 210) and/or the top portion of the Ge-based layer (e.g., the top 1, 2, 3, 4, 5, 10, 15, or 20% of the Ge-based layer). Also note that in some cases, the defect/dislocation density may include the threading dislocation density. As can be understood based on this disclosure, the techniques described herein for Si substrate modification to enable formation of a thin, relaxed, Ge-based layer allows for the formation of a multitude of different transistor types/configurations/architectures, with various different materials that may or may not be strained. Further, in some embodiments that employ multiple transistor devices (e.g., CMOS circuits), layers 210, 220, and 230 can either be all the same between the multiple transistor devices, or one or more of the layers may be different (e.g., different between NMOS devices and PMOS devices). Numerous variations and configurations will be apparent in light of this disclosure.

Example System

Figure 6:
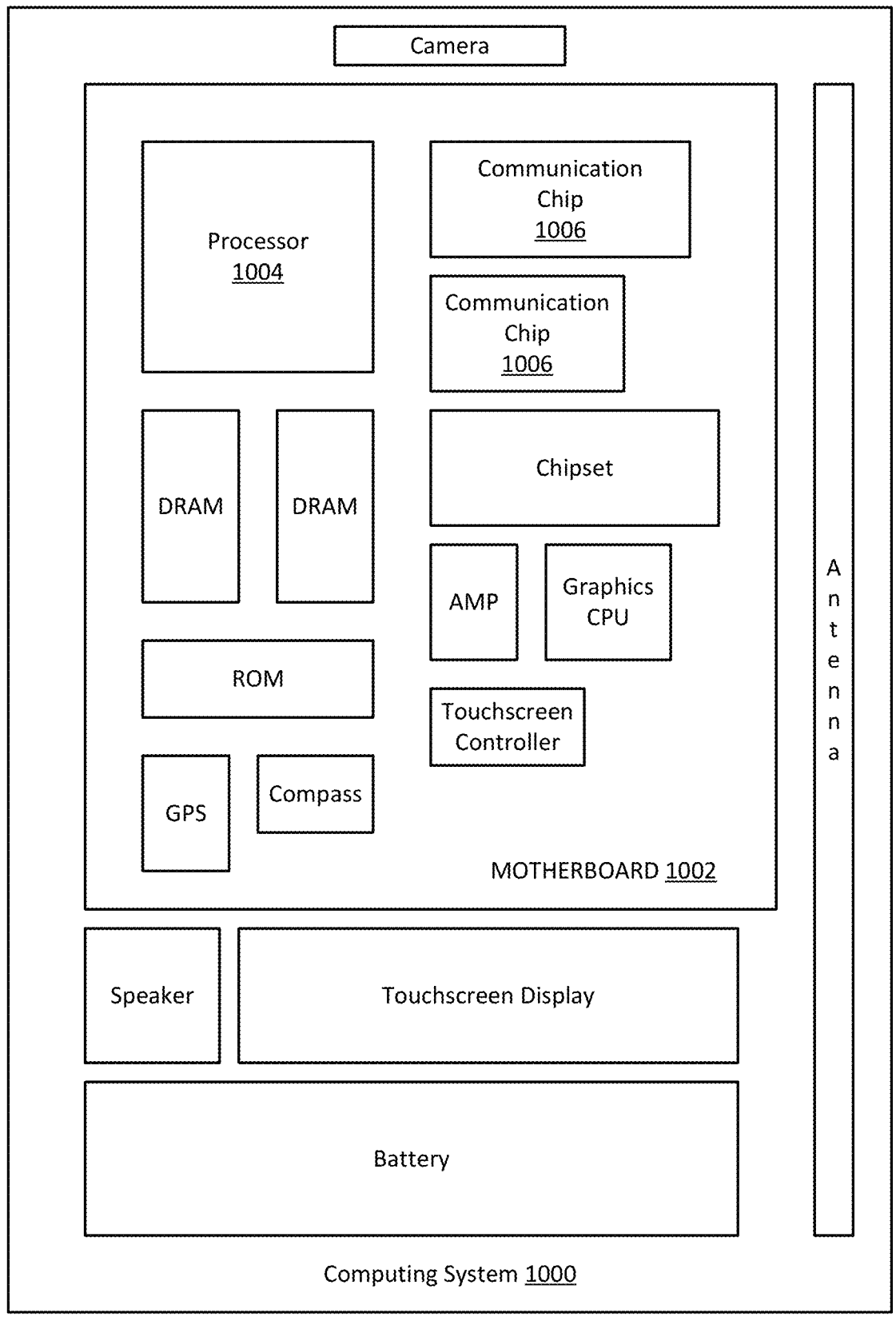
FIG. 6 illustrates a computing system implemented with integrated circuit structures and/or transistor devices formed using the techniques disclosed herein, in accordance with some embodiments of the present disclosure.

FIG. 6 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is an integrated circuit (IC) including at least one transistor, the IC including: a substrate that includes silicon; a first layer on the substrate and including a first monocrystalline semiconductor material, the first layer having a plurality of defects, wherein at least some of the plurality of defects terminate in the substrate; a second layer on the first layer and including a second monocrystalline semiconductor material that includes germanium, the second layer having a maximum vertical thickness of at most 400 nanometers (nm); a channel region above the first layer; a gate structure at least above the channel region; a source region adjacent the channel region; and a drain region adjacent the channel region.

Example 2 includes the subject matter of Example 1, wherein the substrate is a bulk silicon wafer.

Example 3 includes the subject matter of Example 1 or 2, wherein the first layer is native to the substrate.

Example 4 includes the subject matter of Example 1 or 2, wherein the first layer is not native to the substrate and the first monocrystalline semiconductor material includes germanium.

Example 5 includes the subject matter of any of Examples 1-4, wherein the first layer includes silicon, carbon, germanium, hydrogen, helium, phosphorous, boron, arsenic, antimony, tin, indium, gallium, and/or argon.

Example 6 includes the subject matter of any of Examples 1-5, wherein the first layer has a maximum thickness of at most 50 nm.

Example 7 includes the subject matter of any of Examples 1-6, wherein the second monocrystalline semiconductor material further includes silicon, tin, and/or carbon.

Example 8 includes the subject matter of any of Examples 1-7, wherein the second monocrystalline semiconductor material further includes silicon.

Example 9 includes the subject matter of any of Examples 1-8, wherein the second monocrystalline semiconductor material includes at least 30 percent germanium concentration by atomic percentage.

Example 10 includes the subject matter of any of Examples 1-9, wherein the second layer has a top surface including a dislocation density of at most 1E7 per square centimeter.

Example 11 includes the subject matter of any of Examples 1-10, wherein a top surface of the second layer has a lattice constant that is closer to the bulk lattice constant of the second monocrystalline semiconductor material than the bulk lattice constant of silicon.

Example 12 includes the subject matter of any of Examples 1-11, wherein the channel region is at least one of in or on the second layer.

Example 13 includes the subject matter of any of Examples 1-12, wherein the channel region includes a third monocrystalline semiconductor material that is compositionally different than the second monocrystalline semiconductor material.

Example 14 includes the subject matter of Example 13, wherein the third monocrystalline semiconductor material is one of n-type and p-type doped and the second monocrystalline semiconductor material is the other of n-type and p-type doped.

Example 15 includes the subject matter of any of Examples 1-14, wherein the channel region includes at least a portion of the second layer.

Example 16 includes the subject matter of any of Examples 1-15, wherein the at least one transistor is a non-planar transistor.

Example 17 includes the subject matter of any of Examples 1-16, further including a complementary metal-oxide-semiconductor (CMOS) circuit including a first transistor including the channel region and a second transistor formed above the first layer, wherein one of the first and second transistors is an n-channel transistor and the other of the first and second transistors is a p-channel transistor.

Example 18 includes the subject matter of Example 17, wherein the n-channel transistor includes tensile strain throughout a corresponding channel region and the p-channel transistor includes compressive strain throughout a corresponding channel region.

Example 19 is a computing system including the subject matter of any of Examples 1-18.

Example 20 is an integrated circuit (IC) including at least one transistor, the IC including: a bulk silicon substrate; a layer above the substrate and including monocrystalline semiconductor material that includes germanium, the layer having a maximum vertical thickness of at most 300 nanometers (nm), the layer further having a top surface including a dislocation density of at most 1E7 per square centimeter; an intervening layer between the layer and the substrate, the intervening layer including monocrystalline semiconductor material and having a maximum thickness of at most 50 nm; a channel region above the intervening layer; a gate structure at least above the channel region; a source region adjacent the channel region; and a drain region adjacent the channel region.

Example 21 includes the subject matter of Example 20, wherein the intervening layer is on the substrate.

Example 22 includes the subject matter of Example 20 or 21, wherein the layer is on the intervening layer.

Example 23 includes the subject matter of any of Examples 20-22, wherein the intervening layer is native to the substrate.

Example 24 includes the subject matter of any of Examples 20-22, wherein the intervening layer is not native to the substrate, such that a distinct interface exists between the intervening layer and the substrate.

Example 25 includes the subject matter of any of Examples 20-24, wherein the intervening layer includes silicon, carbon, germanium, hydrogen, helium, phosphorous, boron, arsenic, antimony, tin, indium, gallium, and/or argon.

Example 26 includes the subject matter of any of Examples 20-25, wherein the intervening layer has a maximum thickness of at most 25 nm.

Example 27 includes the subject matter of any of Examples 20-26, wherein the intervening layer further includes silicon, tin, and/or carbon.

Example 28 includes the subject matter of any of Examples 20-27, wherein the layer further includes silicon.

Example 29 includes the subject matter of any of Examples 20-28, wherein the layer includes at least 30 percent germanium concentration by atomic percentage.

Example 30 includes the subject matter of any of Examples 20-29, wherein the intervening layer includes a plurality of defects and wherein a majority of the plurality of defects terminate in the substrate.

Example 31 includes the subject matter of any of Examples 20-30, wherein a top surface of the layer has a lattice constant that is closer to the bulk lattice constant of the semiconductor material of the layer than the bulk lattice constant of Si.

Example 32 includes the subject matter of any of Examples 20-31, wherein the channel region is at least one of in or on the layer.

Example 33 includes the subject matter of any of Examples 20-32, wherein the channel region includes other monocrystalline semiconductor material that is compositionally different than the monocrystalline semiconductor material included in the layer.

Example 34 includes the subject matter of Example 33, wherein the monocrystalline semiconductor material included in the layer is one of n-type and p-type doped and the other monocrystalline semiconductor material is the other of n-type and p-type doped.

Example 35 includes the subject matter of any of Examples 20-34, wherein the channel region includes at least a portion of the layer.

Example 36 includes the subject matter of any of Examples 20-35, wherein the at least one transistor is a non-planar transistor.

Example 37 includes the subject matter of any of Examples 20-36, further including a complementary metal-oxide-semiconductor (CMOS) circuit including a first transistor including the channel region and a second transistor formed above the intervening layer, wherein one of the first and second transistors is an n-channel transistor and the other of the first and second transistors is a p-channel transistor.

Example 38 includes the subject matter of Example 37, wherein the n-channel transistor includes tensile strain throughout all of a corresponding channel region and the p-channel transistor includes compressive strain throughout all of a corresponding channel region.

Example 39 is a mobile computing system including the subject matter of any of Examples 20-38.

Example 40 is a method of forming an integrated circuit (IC) including at least one transistor, the method including: providing a substrate that includes silicon; forming a first layer on the substrate and including a first monocrystalline semiconductor material, the first layer having a plurality of defects, wherein at least some of the plurality of defects terminate in the substrate; forming a second layer on the first layer and including a second monocrystalline semiconductor material that includes germanium, the second layer having a maximum vertical thickness of at most 400 nanometers (nm); forming a channel region above the first layer; forming a gate structure at least above the channel region; forming a source region adjacent the channel region; and forming a drain region adjacent the channel region.

Example 41 includes the subject matter of Example 40, wherein forming the first layer includes epitaxially growing the first layer on the substrate.

Example 42 includes the subject matter of Example 40 or 41, wherein forming the first layer includes ion implantation of material into a top surface of the substrate.

Example 43 includes the subject matter of any of Examples 40-42, wherein the first and second layers are formed via blanket deposition.

Example 44 includes the subject matter of any of Examples 40-42, wherein the first and second layers are formed in a fin-shaped trench above the substrate and between two regions of shallow trench isolation material.

Example 45 includes the subject matter of any of Examples 40-44, further including a third layer on the third layer, the third layer including a third monocrystalline semiconductor material that is strained to the second layer.

Example 46 includes the subject matter of Example 45, wherein the third monocrystalline semiconductor material is a group IV semiconductor material.

Example 47 includes the subject matter of Example 45, wherein the third monocrystalline semiconductor material is a group III-V semiconductor material.

Example 48 includes the subject matter of any of Examples 45-47, wherein the strain is compressive strain.

Example 49 includes the subject matter of any of Examples 45-47, wherein the strain is tensile strain.

Example 50 includes the subject matter of any of Examples 45-47, wherein the second monocrystalline semiconductor material is one of n-type and p-type doped and wherein the third monocrystalline semiconductor material is the other of n-type and p-type doped relative to the second monocrystalline semiconductor material.

Example 51 includes the subject matter of any of Examples 40-50, wherein the gate structure is formed prior to forming the source and drain regions using a gate first fabrication process.

Example 52 includes the subject matter of any of Examples 40-50, wherein the gate structure is formed after forming the source and drain regions using a gate last fabrication process.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit (IC) comprising:
   a substrate that includes silicon;
   a first layer on the substrate and including a first monocrystalline semiconductor material, the first layer having a plurality of defects, wherein at least some of the plurality of defects terminate in the substrate;
   a second layer on the first layer and including a second monocrystalline semiconductor material that includes germanium, the second layer having a maximum vertical thickness of at most 400 nanometers (nm);
   a strained channel structure above the first layer;
   a gate structure at least above the channel structure;
   a source region adjacent the channel structure; and
   a drain region adjacent the channel structure, such that the channel structure is laterally between the source region and the drain region.

2. The IC of claim 1, wherein the substrate is monocrystalline silicon.

3. The IC of claim 1, wherein the first layer is native to the substrate.

4. The IC of claim 1, wherein the first layer is not native to the substrate and the first monocrystalline semiconductor material includes germanium.

5. The IC of claim 1, wherein the first layer includes at least one of silicon, carbon, germanium, hydrogen, helium, phosphorous, boron, arsenic, antimony, tin, indium, gallium, or argon.

6. The IC of claim 1, wherein the first layer has a maximum thickness of at most 50 nm.

7. The IC of claim 1, wherein the second monocrystalline semiconductor material further includes at least one of silicon, tin, or carbon.

8. The IC of claim 1, wherein the second monocrystalline semiconductor material includes at least 30 percent germanium concentration by atomic percentage.

9. The IC of claim 1, wherein the second layer has a top surface including a dislocation density of at most 1E7 per square centimeter.

10. The IC of claim 1, wherein a top surface of the second layer has a lattice constant that is closer to the bulk lattice constant of the second monocrystalline semiconductor material than the bulk lattice constant of silicon.

11. The IC of claim 1, wherein the channel structure is at least one of in or on the second layer.

12. The IC of claim 1, wherein the channel structure includes a third monocrystalline semiconductor material that is compositionally different than the second monocrystalline semiconductor material.

13. The IC of claim 12, wherein the third monocrystalline semiconductor material is one of n-type and p-type doped and the second monocrystalline semiconductor material is the other of n-type and p-type doped.

14. The IC of claim 1, wherein the channel structure includes at least a portion of the second layer.

15. The IC of claim 1, wherein the channel structure is a first channel structure, the IC further comprising a complementary metal-oxide-semiconductor (CMOS) circuit including a first transistor and a second transistor, the first transistor including the first channel structure, and the second transistor including a second channel structure also above the first layer, wherein one of the first and second transistors is an n-channel transistor and the other of the first and second transistors is a p-channel transistor, wherein the n-channel transistor includes tensile strain in the corresponding channel structure and the p-channel transistor includes compressive strain in the corresponding channel structure.

16. An integrated circuit (IC) comprising:
a bulk silicon substrate;
a layer above the substrate and including monocrystalline semiconductor material that includes germanium, the layer having a maximum vertical thickness of at most 300 nanometers (nm), the layer further having a top surface including a dislocation density of at most 1E7 per square centimeter;
an intervening layer between the layer and the substrate, the intervening layer including monocrystalline semiconductor material and having a maximum thickness of at most 50 nm;
a channel region above the intervening layer;
a gate structure at least above the channel region;
a source region adjacent the channel region; and
a drain region adjacent the channel region.

17. The IC of claim 16, wherein the intervening layer is native to the substrate.

18. The IC of claim 16, wherein the intervening layer is not native to the substrate, such that a distinct interface exists between the intervening layer and the substrate.

19. An integrated circuit (IC) comprising:
a substrate of monocrystalline silicon;
a layer on the substrate and including monocrystalline semiconductor material that includes silicon and germanium, the germanium being at a concentration of less than 35 atomic percent, the layer having a maximum vertical thickness of less than 250 nanometers (nm), wherein an interface between the layer and the substrate includes defects, and the defects terminate within the substrate and/or in a bottom portion of the layer, such that none of the defects run to a top surface of the layer;
a PMOS device on the layer and having a first gate structure on at least top and side surfaces of a compressively strained region comprising monocrystalline semiconductor material; and
an NMOS device on the layer and having a second gate structure on at least top and side surfaces of a tensile strained region comprising monocrystalline semiconductor material.

20. The IC of claim 19, wherein the top surface of the layer has a dislocation density of 1E7 per square centimeter or less, and the layer has greater than 80% relaxation.

* * * * *